United States Patent
Kohama et al.

(10) Patent No.: US 6,184,526 B1
(45) Date of Patent: Feb. 6, 2001

(54) APPARATUS AND METHOD FOR INSPECTING PREDETERMINED REGION ON SURFACE OF SPECIMEN USING ELECTRON BEAM

(75) Inventors: Yoshiaki Kohama, Kawasaki; Muneki Hamashima, Urayasu; Shigeru Takemoto, Kawasaki, all of (JP)

(73) Assignee: Nikon Corporation, Tokyo (JP)

( * ) Notice: Under 35 U.S.C. 154(b), the term of this patent shall be extended for 0 days.

(21) Appl. No.: 09/362,099

(22) Filed: Jul. 28, 1999

Related U.S. Application Data

(63) Continuation-in-part of application No. 09/003,874, filed on Jan. 7, 1998, now abandoned.

(30) Foreign Application Priority Data

| Jan. 8, 1997 | (JP) | 9-001178 |
| Jan. 8, 1997 | (JP) | 9-001179 |
| Jan. 8, 1997 | (JP) | 9-001181 |
| Oct. 5, 1998 | (JP) | 10-282394 |

(51) Int. Cl.[7] ............................................ H01J 37/252
(52) U.S. Cl. ............................................ 250/310; 250/397
(58) Field of Search .................................. 250/310, 397, 250/306, 307

(56) References Cited

U.S. PATENT DOCUMENTS

| 5,448,064 | * | 9/1995 | Matsuyama | 250/310 |
| 5,466,934 | | 11/1995 | Adams et al. | 250/310 |
| 5,483,065 | * | 1/1996 | Sato et al. | 250/310 |
| 5,502,306 | | 3/1996 | Meisburger et al. | 250/310 |
| 5,576,833 | | 11/1996 | Miyoshi et al. | 356/394 |
| 5,578,821 | | 11/1996 | Meisberger et al. | 250/310 |
| 5,717,206 | * | 2/1998 | Watanabe et al. | 250/310 |

FOREIGN PATENT DOCUMENTS

| 4-242060 | 8/1992 | (JP) . |
| 5-109381 | 4/1993 | (JP) . |
| 5-258703 | 10/1993 | (JP) . |
| 7-249393 | 9/1995 | (JP) . |

OTHER PUBLICATIONS

Tsuno, "Simulation of a Wien Filter As Beam Separator in A Low Energy Electron Microscope", *Ultramicroscopy*, vol. 55:127–140, (1994).

Dalsa brochure, Model CT–E1/F2 Quietsensor Camera, TD Series Bidirectional TDI Array, (Jun. 1997).

* cited by examiner

*Primary Examiner*—Kiet T. Nguyen
(74) *Attorney, Agent, or Firm*—Foley & Lardner

(57) ABSTRACT

This invention concerns an apparatus and a method for observing and inspecting a predetermined area in a surface of a sample by use of an electron beam. The apparatus according to this invention comprises an MCP for multiplying a secondary beam emerging from the surface of the sample. The apparatus and method employ a CCD TDI array in order to increase the lifetime of the MCP, and special scan control is carried out in the observation and inspection operation. In addition, the apparatus according to this invention has various structures for enabling correction for positional deviation of the sample and high-speed processing.

32 Claims, 23 Drawing Sheets

PRIMARY BEAM
SECONDARY BEAM

PRIMARY BEAM
MAGNETIC FIELD B
FB
FE
ELECTRIC FIELD E

SECONDARY BEAM
MAGNETIC FIELD B
FB
FE
ELECTRIC FIELD E

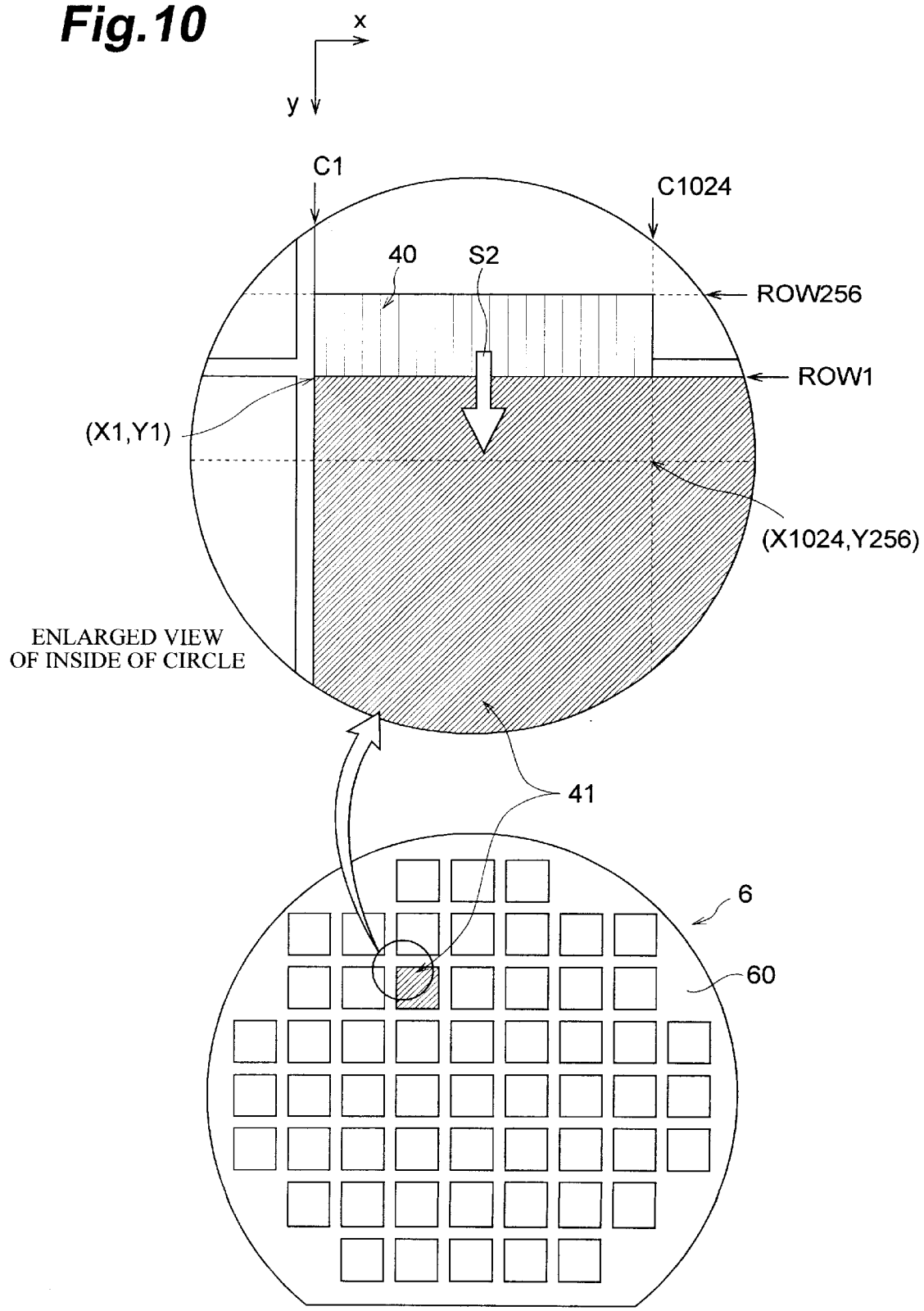

Fig.11

|  | PRIOR-ART EXAMPLE | FIRST EMBODIMENT |
|---|---|---|
| SAMPLING RATE | 120 MHz/pix | 120 MHz/pix |
| OVERALL OUTPUT CHARGE TO END OF LIFE OF MCP | 100 C/cm$^2$ | 100 C/cm$^2$ |
| SAMPLE SIZE OF ONE PIXEL | 0.1 $\mu$m | 0.1 $\mu$m |
| PROJECTION MAGNITICATION OF SECONDARY ELECTRONS | 500 | 500 |
| NUMBER OF HORIZONTAL PIXELS FOR CCD IMAGING | 1024 pix | 1024 pix |
| NUMBER OF VERTICAL PIXELS FOR CCD IMAGING | 1 line | 256 line |
| HORIZONTAL LENGTH FOR MCP IMAGING | 5.12 cm | 5.12 cm |
| VERTICAL LENGTH FOR MCP IMAGING | 0.005 cm | 1.28 cm |
| AREA FOR MCP IMAGING | 0.0256 cm$^2$ | 6.5536 cm$^2$ |
| NECCESSARY MCP OVERALL OUTPUT CURRENT | 15 $\mu$A | 15 $\mu$A |
| LIFETIME OF MCP | 47 hours | 12100 hours |

APPARATUS AND METHOD FOR INSPECTING PREDETERMINED REGION ON SURFACE OF SPECIMEN USING ELECTRON BEAM

RELATED APPLICATION

This is a Continuation-In-Part application of application Ser. No. 09/003,874 filed on Jan. 7, 1998, now abandoned.

BACKGROUND OF THE INVENTION

1. Field of the Invention

The present invention relates to an apparatus and method for successively inspecting a plurality of patterns provided on a surface of a sample such as a wafer or a mask by use of an electron beam and, more particularly, to a configuration for detecting at least one of secondary electrons, reflected electrons, and back-scattered electrons from the surface of the sample irradiated by the electron beam.

2. Related Background Art

With recent increase in integration of LSI, the detection sensitivity required for detection of defect on the surface of the sample such as the wafer or the mask is becoming higher and higher. For example, where 256M-DRAM is formed on the wafer of the line width 0.25 $\mu$m, the detection sensitivity necessary for this wafer is that enough to detect a defect in the dimension of 0.1 $\mu$m. Desires are also increasing for inspection apparatus satisfying the demand for increase in the inspection speed, as well as the increase in the sensitivity for detection of defect. In order to meet these demands, surface inspection devices (pattern inspection apparatus) utilizing the electron beam have been developed.

An example of the conventional pattern inspection apparatus using the electron beam is the inspection apparatus, for example, described in Japanese Laid-open Patent Applications No. Hei 5-258703 (U.S. Pat. No. 5,502,306) and No. Hei 7-249393 (U.S. Pat. No. 5,576,833).

FIG. 1 is a drawing to show the configuration of the conventional pattern inspection apparatus disclosed in above Japanese Laid-open Patent Application No. Hei 7-249393. This conventional pattern inspection apparatus is composed of a primary column 81, the primary column 81 consisting of an electron gun having a rectangular cathode for generating a rectangular electron beam and a quadrupole lens system, and a projection type secondary electron detecting column (secondary column) 84 for detecting secondary electrons or reflected electrons from the sample surface (electron beam irradiation area 85) being an inspected object. When the primary column 81 emits the electron beam (primary beam) to the electron beam irradiation area 85 on the sample 82, the secondary beam 83 of secondary electrons or the like from the electron beam irradiation area 85 is guided to an electron incident surface of electron detector 86 by an electron lens system for beam shaping provided in the secondary column 84. Then an electron image of the electron beam irradiation area 85 is taken as electric signals into detection signal processing circuit 87. By this arrangement wherein the electron optical system is composed of the rectangular cathode and quadrupole lens system, the electron beam irradiation area 85 on the sample 82 irradiated by the primary beam can be shaped readily and arbitrarily. This conventional pattern inspection apparatus is characterized in that high detection sensitivity is achieved and the inspection time for scanning the entire surface of sample can be decreased largely, by generation of the rectangular electron beam with an appropriate aspect ratio.

Next, various detecting systems have been proposed as secondary electron detecting systems for detecting the secondary electrons from the electron beam irradiation area in the surface of sample. An example is a secondary electron detector comprised of MCP/fluorescent screen/linear image sensor. FIG. 2 is a cross-sectional view to show the structure of the conventional secondary electron detector. The secondary electrons emitted from the electron beam irradiation area in the surface of sample travel through the secondary electron detecting column and then are multiplied by microchannel plate (MCP) 71. A fiber optic plate (FOP) the input surface of which is coated with a fluorescent film 72 is located behind this MCP 71. A group of electrons multiplied by the MCP 71 are converted to light by the fluorescent film 72 and thereafter the electrons are guided through the FOP 73 into MOS linear image sensor 74 to be further converted to electric signals.

SUMMARY OF THE INVENTION

The inventors examined the prior art described above and found the following problems.

Specifically, the conventional secondary electron detector uses the MCP, and the area where the secondary electrons generated in the surface of sample arrive also has such a high aspect ratio as to be long in a predetermined direction, similar to the cross-sectional shape of the electron beam emitted to the surface of sample. Therefore, the area of the electron incident region in the MCP being an electron multiplying means also becomes very small.

It is generally known that the MCP lowers its relative gain down to about 60% when the overall output charge per unit area becomes 0.1 C/cm$^2$. Accordingly, the small use area of MCP (the area of the region where the electron beam from the surface of sample is incident) poses a problem that the lifetime of the MCP becomes shortened.

On the other hand, noting the inspection accuracy of defect in the surface of sample, consideration must be given to the possibility that the position of the sample could deviate while a stage with the sample mounted thereon is continuously moved. The positional deviation of the sample occurring during inspection will make the resultant sample image imperfect. No consideration is given to this problem in the conventional pattern inspection apparatus, which will hinder the inspection of patterns or the like on the wafer, for example.

The present invention has been accomplished mainly to solve the above problems and an object of the present invention is to provide an inspection apparatus and an inspection method in the structure that can increase the lifetime of the MCP while maintaining the high inspection accuracy.

The pattern inspection apparatus according to the present invention basically comprises a primary column including an illumination system for emitting an electron beam (primary beam) to a surface of a sample and a secondary column for guiding an electron beam (secondary beam) from the surface of the sample to an electron detecting system. The primary column comprises an electron gun for emitting the primary beam and a quadrupole lens system for guiding the primary beam to a predetermined area in the surface of the sample and for shaping a cross section of the primary beam, and the secondary column also comprises a quadrupole lens system for focusing an electron image, formed by the secondary beam, at a predetermined magnification on an electron incident surface of the electron detecting system. In the apparatus, the above primary column and secondary column can be incorporated by applying an electromagnetic prism such as a Wien filter for bending an orbit of the primary beam and letting the secondary beam travel straight as shown in FIG. 3; or, they can be constructed separately and independently of each other as shown in FIG. 7 etc.

Specifically, the first embodiment of the pattern inspection apparatus according to the present invention is at least an apparatus for successively inspecting a plurality of patterns provided on a principal surface of a predetermined sample, which comprises an irradiation system for emitting an electron beam to a predetermined area (electron beam irradiation area) including an inspection target area in the surface of the sample, a stage capable of moving with the sample being mounted thereon, a position detecting system for detecting a position of the stage, and an electron detecting system for detecting at least either of secondary electrons, reflected electrons, and back-scattered electrons from the electron beam irradiation area on the sample irradiated by the electron beam.

The above electron detecting system has a microchannel plate (MCP) for multiplying at least either of secondary electrons, reflected electrons, and back-scattered electrons arriving thereat from the electron beam irradiation area, a fluorescent section for converting a group of electrons multiplied and outputted by the MCP to light, a CCD TDI array (TDI CCD image sensor), located opposite to the MCP with the fluorescent section in between, for receiving the light excited by the fluorescent section, and a detection control system for controlling driving of the CCD TDI array, based on information about the position of the electron beam irradiation area on the sample, obtained from the position detecting system.

Particularly, the pattern inspection apparatus of the first embodiment is characterized by further comprising a scan control mechanism for continuously moving the electron beam irradiation area on the sample while checking the position of the stage, based on an output signal from the position detecting system, as well as the above CCD TDI array. In this case, the scan control mechanism has at least either one of a first configuration for continuously moving the stage while checking the position of the stage, based on the output signal from the position detecting system, in such a state that an irradiation direction of the electron beam emitted from the irradiation system toward the sample is kept stationary in a predetermined direction, and a second configuration for shifting the electron beam irradiation area on the surface in a predetermined direction along the principal surface of the sample in such a state that the stage is kept stationary at a predetermined position. In the pattern inspection apparatus according to the present invention, in order to enlarge the use area of the MCP, the electron beam irradiation area on the sample is shaped preferably in a rectangular shape (for example, 200 $\mu$m square) or in an elliptic shape.

Accordingly, a pattern inspection method according to the present invention, which utilizes the pattern inspection apparatus of the first embodiment described above, comprises at least a first step of moving an inspection target area on a sample into a space where an electron beam emitted from the illumination system arrives, a second step of continuously moving the electron beam irradiation area by moving at least either one of the irradiation direction of the electron beam and the stage, and a third step of detecting by the CCD TDI array information of an image of the inspection target area included in a group of electrons consisting of at least either of secondary electrons, reflected electrons, and back-scattered electrons from the electron beam irradiation area.

In the pattern inspection method to realize this first embodiment, it can also be contemplated that a fluorescent member is located on an orbit of the group of electrons from the electron beam irradiation area on the sample and that the group of electrons are converted to light by the fluorescent member. In this case, the light excited by the fluorescent member is made incident to an image pickup surface of the above CCD TDI array. Further, in order to multiply the group of electrons reaching the fluorescent member, a microchannel plate may be placed so that the fluorescent member is interposed between the CCD TDI array and the microchannel plate.

In the second embodiment of the pattern inspection apparatus according to the present invention, the CCD TDI array forming a part of the electron detecting system can be used in a frame mode. In this case, the sample image can be observed without moving the sample. Here, the frame mode is a mode in which the sample is subjected to image pickup for a fixed period by the CCD TDI array, thereafter the irradiation of image beam to the CCD TDI array is temporarily intercepted by shielding means such as a mechanical shutter or an electron beam blanker, and two-dimensional image information (stored charges) stored in the CCD TDI array is taken out row by row in order.

Namely, the pattern inspection apparatus of the second embodiment is characterized in that the above electron detecting system further comprises the shielding structure for temporarily intercepting the light incident to the CCD TDI array, in addition to the MCP, fluorescent section, and CCD TDI array.

Next, the third embodiment of the pattern inspection apparatus according to the present invention comprises at least an irradiation system for emitting an electron beam to a predetermined area (electron beam irradiation area) including an inspection target area in a surface of a sample, a stage capable of moving with the sample being mounted thereon, an electron detecting system for detecting at least either of secondary electrons, reflected electrons, and back-scattered electrons from the electron beam irradiation area, and an image display system for displaying an image of the inspection target area included in the electron beam irradiation area on the sample, based on an output signal from the electron detecting system. The above electron detecting system comprises at least an MCP for multiplying at least either of secondary electrons, reflected electrons, and back-scattered electrons arriving thereat from the electron beam irradiation area, a fluorescent section for converting a group of electrons multiplied and outputted by the MCP to light, and a CCD TDI array, located opposite to the MCP with the fluorescent section in between, for receiving the light excited by the fluorescent section. In this specification, the electron detecting system includes an electron detector having a secondary column, an MCP, a fluorescent section, and a CCD TDI array (i.e., an MCP assembly detector).

Particularly, in this pattern inspection apparatus of the third embodiment, the above irradiation system has a first alignment deflector for deflecting the electron beam and the above electron detecting system has a second alignment deflector for deflecting the electron beam from the electron beam irradiation area. The pattern inspection apparatus of the third embodiment is characterized by comprising a correction control system for, based on information about positional deviation of the stage obtained from the above position detecting system, correcting a position and a rotational angle of an electron image to be detected by the electron detecting system, said electron image being an image of the inspection target area formed by the electron beam from the electron beam irradiation area.

In this third embodiment, specific correction methods include a first correction method for deflecting the electron beam incident to the electron detecting system and a second correction method for moving the electron incident surface itself of the electron detecting system, specifically rotating the electron incident surface. For realizing the first correction method, the above correction control system can be constructed in a configuration including an alignment control system for controlling the first and second alignment deflectors independently of each other. For realizing the above second correction method, the correction control system can be constructed in a configuration including a drive section for moving, specifically rotating, the above electron detecting system (specifically, the electron detection surface), and a drive control system for outputting a control signal to this drive section. This drive section includes a motor or the like. In either configuration, the correction control system comprises an arithmetic section for calculating an amount of positional deviation of the stage from the position information of the stage obtained from the position detecting system and information of drive instruction of the stage.

The timing of correction by the above correction control system can be determined so that the correction operation is carried out in real time or is carried out every output of image information of one line unit from the CCD TDI array. The above information of positional deviation of the stage includes first positional deviation information corresponding to an amount of deviation along a first direction in which the stage can move, second positional deviation information corresponding to an amount of deviation along a second direction perpendicular to the first direction, and third positional deviation information corresponding to an amount of rotational deviation about a third direction perpendicular to the first and second directions.

In the pattern inspection apparatus according to the present invention, when attention is focused on the processing speed in the continuous inspection of sample, a camera provided with a two-way image pickup function (a TDI camera) has to be used as the CCD TDI array in order to minimize the turn time of the stage. However, the two-way TDI camera does not permit the number of cumulative lines of CCD TDI array to be set variably and the number of cumulative lines must be set to be fixed. This forces us to select the TDI camera with the first priority to the conditions in which the apparatus can operate stably, which will pose a problem of no freedom in setting such a condition that the number of cumulative lines is optimized according to damage characteristics of sample by irradiation of electron beam or is optimized according to whether the installation environment of the apparatus is good or not (depending upon the magnitude of vibration of the floor, the magnitude of varying magnetic field, etc.).

A considerable cost for development is necessary for developing the TDI camera capable of undergoing the two-way image pickup and changing the number of cumulative lines. Further, the internal structure of the CCD TDI array becomes complex and the aperture rate of CCD TDI array also becomes lowered, in turn degrading the effect of line accumulation.

Thus the fourth embodiment of the pattern inspection apparatus according to the present invention is at least a pattern inspection apparatus for successively inspecting a plurality of patterns provided on a principal surface of a sample, in which an image of an inspection target area detected is inverted and an inverted image is displayed, in response to a change of scan direction of the electron beam irradiation area in the surface of the sample.

A fundamental configuration of the pattern inspection apparatus according to the fourth embodiment comprises an irradiation system for emitting an electron beam to a predetermined area (electron beam irradiation area) including an inspection target area in the surface of the sample, an electron detector for detecting an electron image of the inspection target area formed by at least either of secondary electrons, reflected electrons, and back-scattered electrons from the electron beam irradiation area, and a projection type electron optical system for focusing the electron image of the electron beam irradiation area on the sample, on an electron incident surface of the electron detector.

Particularly, the above projection type electron optical system comprises an electron optical system at least located on an orbit of a group of electrons traveling from the electron beam irradiation area on the sample to the electron detector in order to focus the electron image of the inspection target area on the electron incident surface of the above electron detector, the electron optical system being comprised of a plurality of electrostatic lenses.

The pattern inspection apparatus of the fourth embodiment may further comprise an image display system for displaying an image of the inspection target area included in the electron beam irradiation area on the sample, based on an output signal from the electron detector, and a control system for controlling the projection type electron optical system to invert the electron image focused on the electron incident surface of the electron detector and display an inverted image thereof at predetermined timing on the image display system.

In addition, the pattern inspection apparatus of the fourth embodiment comprises a stage capable of moving with the sample being mounted thereon, and a position detecting system for detecting a position of the stage, wherein the control system controls the projection type electron optical system so as to invert the electron image focused on the electron incident surface of the electron detector and to display an inverted image thereof on said image display system, at a time of change in a moving direction of the stage.

The pattern inspection apparatus of the fourth embodiment may also adopt the CCD TDI array as the above electron detector in order to increase the lifetime of MCP. In this case, the CCD TDI array is of the cumulative line changeable type, wherein the number of cumulative lines can be changed according to the sample being an inspected object.

Further, in this pattern inspection apparatus of the fourth embodiment, the above irradiation system preferably has a mechanism for changing a current amount of the electron beam emitted to the sample.

A pattern inspection method according to the present invention, which utilizes the pattern inspection apparatus of the fourth embodiment described above, comprises at least a first step of emitting an electron beam to an electron beam irradiation area including an inspection target area on a sample and capturing a group of electrons consisting of at least either of secondary electrons, reflected electrons, and back-scattered electrons from the electron beam irradiation area, and a second step of focusing an electron image formed by the group of electrons from the electron beam irradiation area at a predetermined magnification on the electron incident surface of the electron detector.

Further, the pattern inspection method for realizing this fourth embodiment comprises a third step carried out after the second step, the third step being a step of inverting the electron image detected by the electron detector (including the CCD TDI array) and displaying an inverted image thereof at predetermined timing on the image display system.

The inversion display in the third step is carried out at a time of change in the moving direction of the electron beam irradiation area on the sample. The CCD TDI array included in the electron detector is preferably of the cumulative line changeable type wherein the number of cumulative lines can be changed according to the sample being an inspected object.

In addition, the above-mentioned CCD TDI array comprises pixels which are arranged two-dimensionally so as to constitute a plurality of lines. The CCD TDI array successively transfers, in synchronization with a transfer signal, charges of pixels constituting each line generated upon receiving an optical image obtained by the above-mentioned converter to addressed corresponding pixels in an adjacent line thereof while adding thereto charges in the addressed pixels, thus successively outputting charges of individual pixels constituting a final line to which charges of individual pixels in a predetermined number of lines to the final line have been added.

The pattern inspection apparatus or electron beam inspection apparatus according to the present invention may further comprise a synchronization deviation detecting system which detects, according to the above-mentioned transfer signal and a detection signal of the above-mentioned position detecting system, a deviation in synchronization between the charge transfer between the above-mentioned adjacent lines and the movement of the above-mentioned optical image by driving the above-mentioned stage. In this case, more vivid images can be obtained by use of a correcting system, including a beam deflector or the like, for correcting the positional deviation of the optical image on the above-mentioned detection surface.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 10 is a drawing for explaining the operation and scan control of the CCD TDI array upon inspection of pattern;

FIG. 11 is a table to compare the performance between the conventional MCP assembly detector and the MCP assembly detector applied to the pattern inspection apparatus according to the present invention;

DETAILED DESCRIPTION OF THE PREFERRED EMBODIMENTS

Each of the embodiments of the pattern inspection apparatus and pattern inspection method according to the present invention will be described referring to FIGS. 3–23, 24A–24C, 25 and 26. In the description of each drawing the same elements will be denoted by the same reference symbols and redundant description thereof will be omitted.

Figure 1:
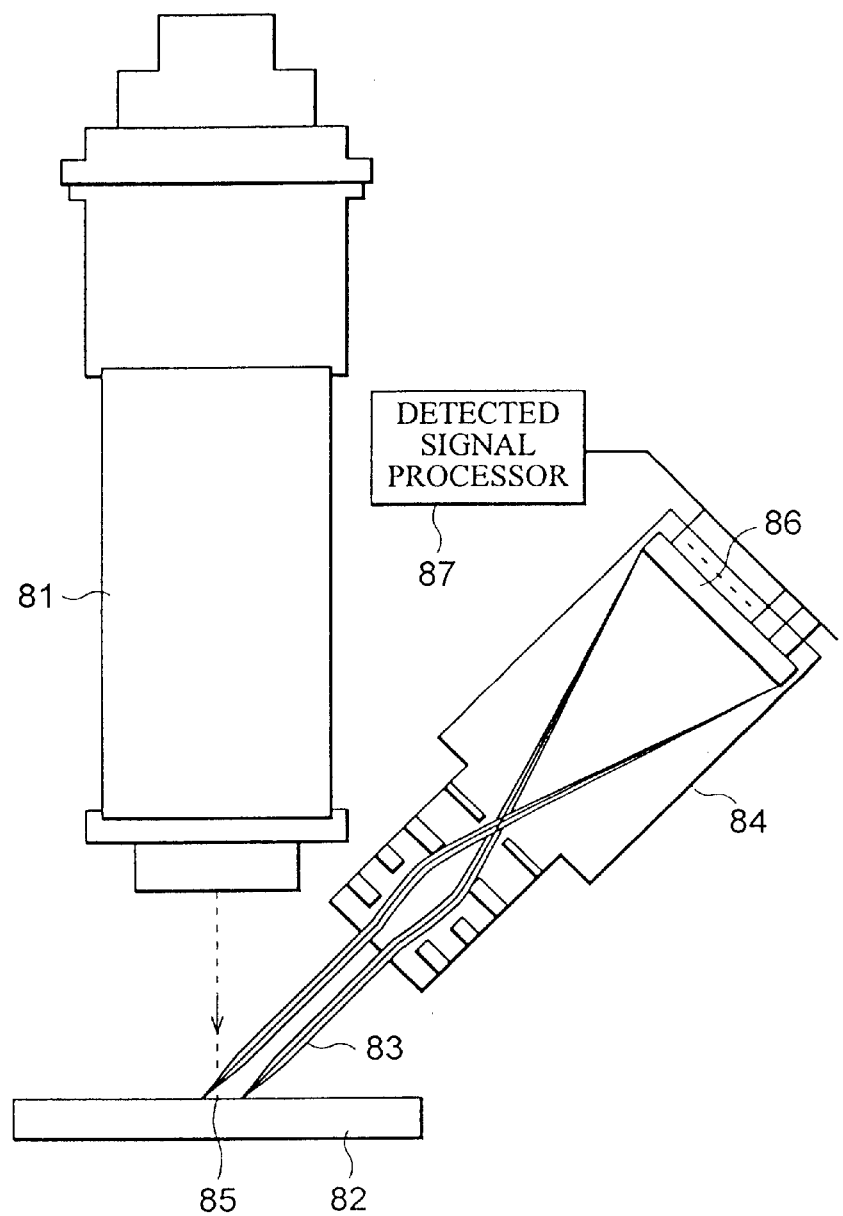
FIG. 1 is a drawing to show the configuration of the conventional pattern inspection apparatus.
Figure 2:
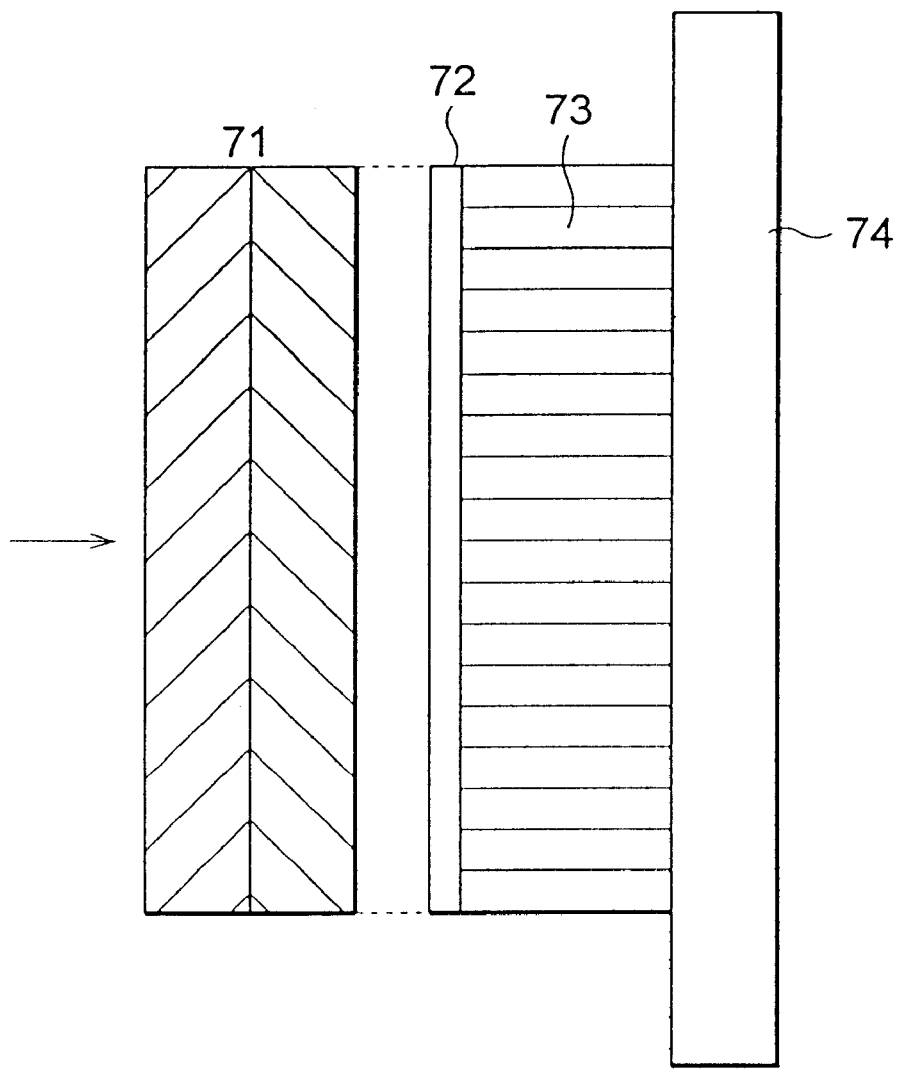
FIG. 2 is a drawing to show the configuration of the conventional secondary electron detector.
Figure 3:
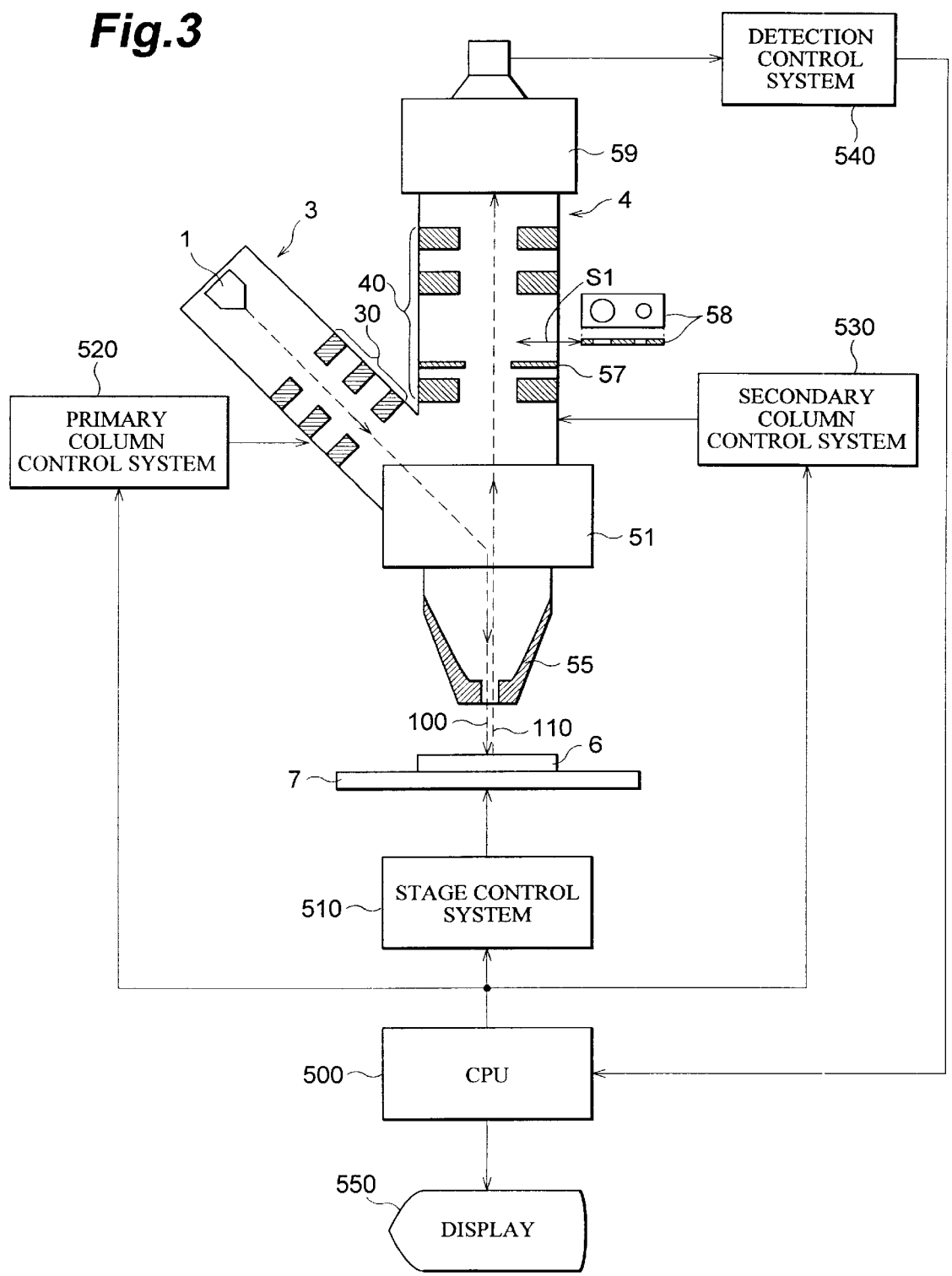
FIG. 3 is a drawing to show the fundamental configuration of the pattern inspection apparatus according to the present invention.

FIG. 3 is a drawing to show the fundamental configuration of the pattern inspection apparatus according to this invention. In this drawing, the pattern inspection apparatus has an X-Y stage 7 for a sample 6 such as a wafer to be mounted thereon, a primary column 3 for guiding an electron beam (a primary beam) 100 emitted from an electron gun 1 to a predetermined area (an electron beam irradiation area) of the sample 6 mounted on the stage 7, a Wien filter 51 as an electromagnetic prism for changing the orbit of the primary beam 100, an electron detector 59 for detecting a secondary beam 110 of secondary electrons, reflected electrons, backscattered electrons, or the like from the electron beam irradiation area of the sample 6, and a secondary column 4 for guiding the secondary beam 110 to the electron detector 59.

The primary column 3 has an electron gun 1 having a rectangular cathode, and a primary lens system 30 for shaping the cross section of the rectangular electron beam emitted from the electron gun 1. The rectangular cathode can be a member of $LaB_6$ from which a large current can be taken out. Quadrupole or octupole electrostatic (or electromagnetic) lenses asymmetric with respect to the rotation axis can be used for the primary lens system 30. The electrostatic lens can converge or diverge the primary beam in directions normal to the traveling direction thereof as the so-called cylindrical lens can. Therefore, when a plurality of such electrostatic lenses (for example, three electrostatic lenses) are prepared and lens conditions of each electrostatic lens are optimized, the desired electron beam irradiation area on the sample 6 can be shaped arbitrarily into a rectangular shape or into an elliptic shape (as shown, for example, by the elliptic irradiation area 6A in FIG. 18) while suppressing loss of the primary beam. The control of the primary column 3 including these electron gun 1 and multi-stage primary lens system 30 (the triple-quadrupole lens system in the drawing) is performed by primary column control system 520 according to directions from CPU 500.

On the other hand, the secondary column 4 has a cathode lens 55 prepared for efficiently guiding the secondary beam 110 from the electron beam irradiation area on the sample 6 to secondary lens system 40, and the secondary lens system 40 comprised of a plurality of electrostatic lens stages. Further, in this secondary column 4, an aperture stop 57 is located at a predetermined position and a field stop 58 provided with plural apertures (field holes) of different diameters is mounted behind the aperture stop 57 with respect to the sample 6 so as to be movable along directions indicated by arrow S1 in the drawing. Each of the elements in the secondary column 4 is controlled by secondary column control system 530 according to directions from the CPU 500.

The electron incident surface of the electron detector 59 is positioned on the image plane where the secondary beam 110 from the sample 6 is converged. Accordingly, an electron image of an inspection target area on the sample 6 is formed on this electron incident surface by the secondary lens system 40. The electron detector 59 converts electrons detected through the secondary lens system 40 to optical signals and further converts the optical signals to photoelectric signals by an image pickup device. The electric signals after the conversion are taken through detection control system 540 into the CPU 500. The CPU 500 outputs a control signal to the primary column control system 520 and to the secondary column control system 530 and also outputs a control signal to stage control system 510 for controlling movement of the stage 7. The primary column control system 520 performs control of lens voltage at least for the primary lens system 30 in the primary column 3 and the secondary column control system 530 performs control of lens voltage at least for the cathode lens 55 and the secondary lens system 40. The CPU 500 is also arranged to be capable of receiving the electric signals detected by the detection control system 540 and displaying the image of the inspection target area included in the electron beam irradiation area on the sample 6, on display 550, based on the signals.

Figure 4:
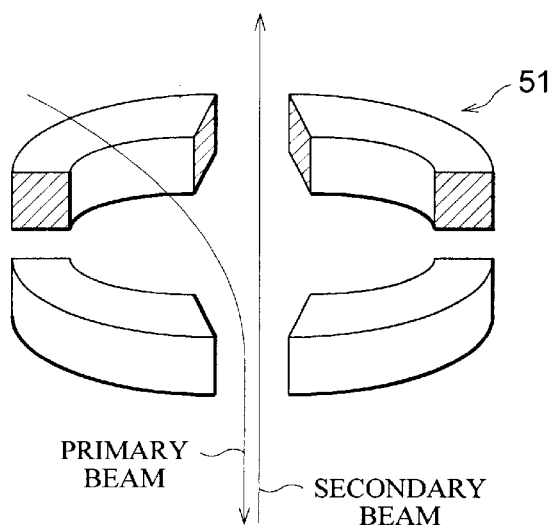
FIG. 4 is a perspective view to show the configuration of the electromagnetic prism (Wien filter) of FIG. 3.
Figure 5:
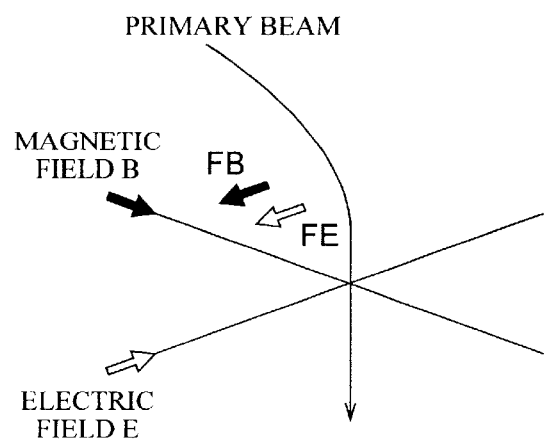
FIG. 5 is a drawing for explaining the orbit of the primary beam passing through the electromagnetic prism of FIG. 4.
Figure 6:
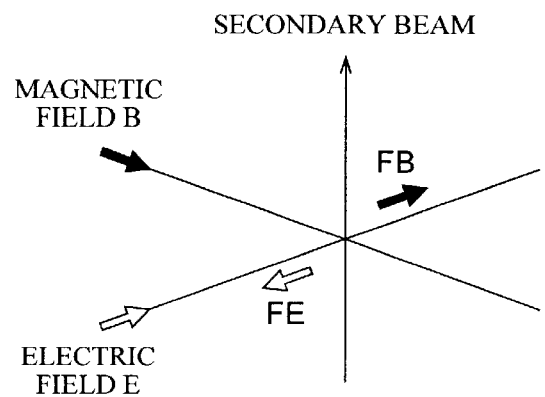
FIG. 6 is a drawing for explaining the orbit of the secondary beam passing through the electromagnetic prism of FIG. 4.

The Wien filter 51 has a shape of a hollow, cylindrical electrode member quartered as shown in FIG. 4 and functions to bend the orbit of the primary beam 100 having passed through the primary lens system 30, by the deflecting action. In the Wien filter 51 the magnetic field is perpendicular to the electric field and, letting E be the electric field, B be the magnetic field, and v be the velocity of a charged particle, the Wien filter 51 lets only a charged particle satisfying the Wien condition of E=vB travel straight and bends the orbit of the other charged particles. Namely, when the primary beam 100 is incident into the Wien filter 51 as shown in FIG. 5, a force FB due to the magnetic field and a force FE due to the electric field are induced and these induced forces bend the orbit of the primary beam 100. On the other hand, when the secondary beam 110 is incident into the Wien filter 51 as shown in FIG. 6, the force FB due to the magnetic field acts in the opposite direction to the force FE due to the electric field, so that such forces cancel each other. Therefore, the secondary beam travels straight as it is.

Next, the fundamental operation of the pattern inspection apparatus of FIG. 3 will be described.

The multi-stage primary lens system 30 in the primary column 3 guides the primary beam 100 emitted from the electron gun 1 to the Wien filter 51. The Wien filter 51 is a deflector acting as an electromagnetic prism and bends the primary beam 100 with specific energy from the primary column 3 at an angle determined by its acceleration voltage, so as to irradiate the predetermined area of sample 6 (the electron beam irradiation area being the inspection target area) normally thereto. On the other hand, the Wien filter 51 allows the secondary beam 110 (at least either of secondary electrons, reflected electrons, and back-scattered electrons) guided from the electron beam irradiation area on the sample 6 through the cathode lens 55 to travel straight as it is and to enter the secondary lens system 40 in the secondary column 4.

The secondary beam 110 passing through the Wien filter 51 is converged by the secondary lens system 40 and is projected to form an enlarged image at a predetermined magnification on the electron incident surface of the electron detector 59. Then the image is converted to image electric signals by the electron detector 59. At this time the aperture stop 57 functions to suppress aberration of the secondary lens system 40 and also to prevent unwanted electrons scattered in the apparatus from being detected by the electron detector 59.

The detection control system 540 takes the image signals (the electric signals after the photoelectric conversion) out of the electron detector 59 and outputs them to the CPU 500. The CPU 500 carries out defect inspection of pattern in the electron beam irradiation area on the sample 6 by image processing algorithm such as template matching or the like from the image signals taken out. The stage control system 510 drives the stage 7 according to directions from the CPU 500 so as to match the irradiation position of electron beam with the next inspection position on the sample 6. Then the above inspection operation is repeated.

Next, the first and second embodiments of the pattern inspection apparatus according to the present invention will be described. Each of these embodiments has such structure that the primary column 3 and secondary column 4 are prepared independently of each other and the electromagnetic prism for changing the orbit of electron beam is excluded; however, the fundamental structure is substantially the same as that of the apparatus having the Wien filter 51 shown in FIG. 3 and it is needless to mention that the primary column and secondary column can be incorporated by applying the Wien filter.

First Embodiment

Figure 7:
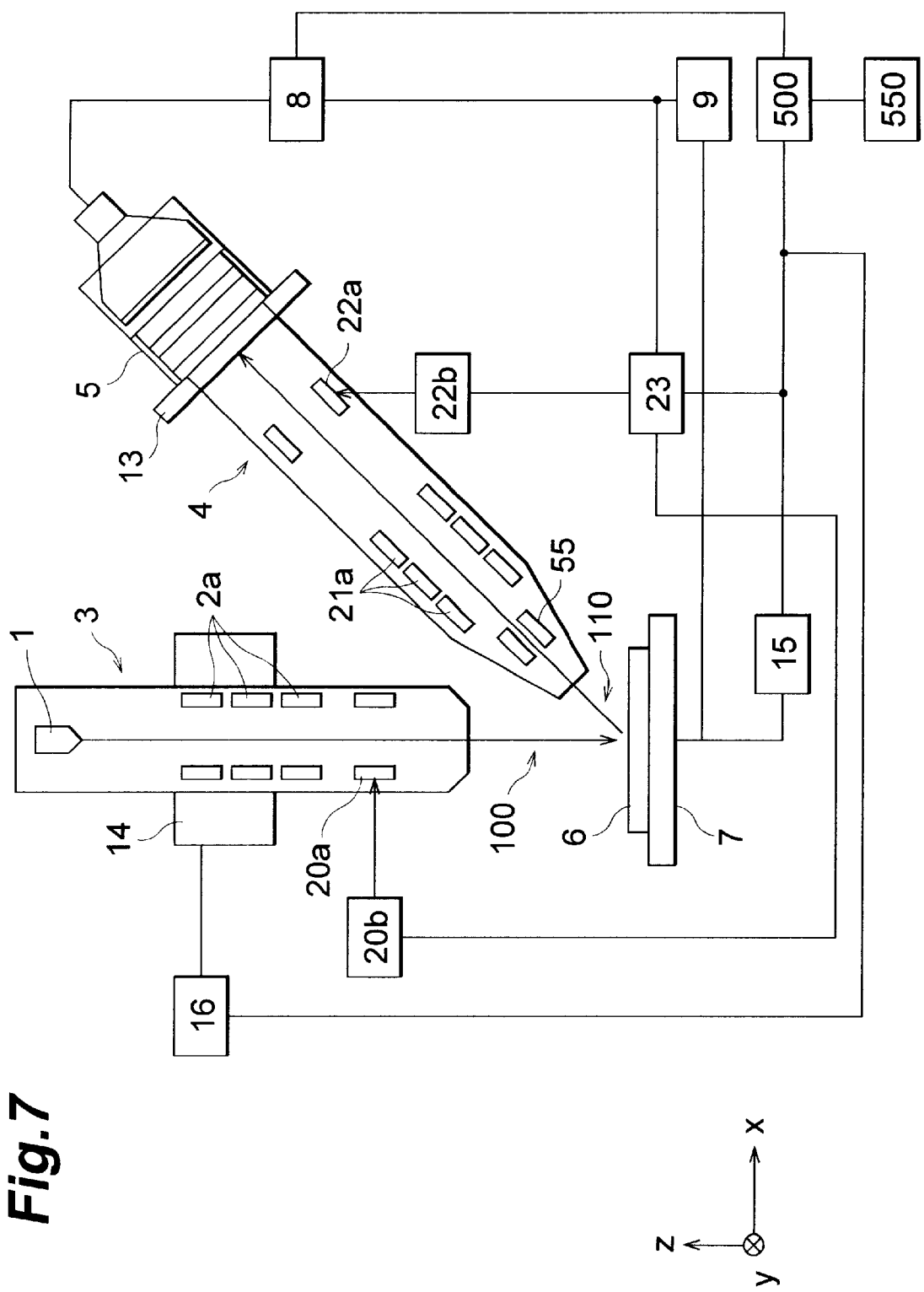
FIG. 7 is a drawing to show the configuration of the first and second embodiments of the pattern inspection apparatus according to the present invention.

FIG. 7 is a drawing to show the configuration of the first embodiment of the pattern inspection apparatus according to the present invention (also including the configuration of the other embodiments including the second embodiment for convenience' sake of explanation). In this figure, the primary column 3 has an electron beam irradiating system comprised of an electron gun 1 for emitting a rectangular electron beam and a quadrupole lens system 2a (corresponding to the primary lens system 30 of FIG. 3). When this irradiating system emits the primary beam 100 to the predetermined inspection target area (included in the electron beam irradiation area) on the sample 6, the secondary beam 110 of secondary electrons, reflected electrons, back-scattered electrons, or the like emerges from the electron beam irradiation area. The secondary beam 110 from the sample 6 is guided through the cathode lens 55 into the secondary column 4 of the projection type, and a quadrupole lens system 21a (corresponding to the secondary lens system 40 of FIG. 3) projects the secondary beam to form an enlarged image on the electron incident surface of MCP assembly detector 5 (corresponding to the electron detector 59 of FIG. 3) (i.e., the image is formed at a predetermined magnification by the quadrupole lens system 21a).

The MCP assembly detector 5 is controlled by a camera driving system (included in the detection control system 540 of FIG. 3) for controlling driving of CCD TDI array camera and image electric signals corresponding to the electron image of the electron beam irradiation area (particularly, the image of the inspection target area) on the sample 6 are taken out thereof.

The sample 6 is mounted on the X-Y stage 7 arranged to be movable in X-Y directions illustrated in the drawing. The stage 7 is controlled by stage driver 15 (included in the stage control system 510 of FIG. 3) to move in the X-axis direction and in the Y-axis direction. The position of the stage is detected by laser interferometer unit 9 (included in the stage control system 510 of FIG. 3) as being a position detector.

Receiving directions from the CPU 500, the stage driver 15 moves the stage 7 by a desired distance along each of the X-axis direction and Y-axis direction and information of position is transmitted from the laser interferometer unit 9 to the camera drive control system 8. Then the image of the inspection target area on the sample 6 (hereinafter referred to as a sample image), picked up by the CCD TDI array, is successively taken into the CPU 500.

In the drawing symbol 20a designates a deflector for deflecting the primary beam 100, provided in the primary column 3. This deflector 20a is controlled in its deflection by deflector driver 20b according to directions from alignment control system 23. Numeral 14 denotes a moving mechanism for moving the whole of the primary column 3, and the movement is controlled by control system 16. Symbol 22a denotes a deflector provided in the secondary column 4 and this deflector 22a is also controlled in its deflection by deflector driver 22b according to directions from the alignment control system 23. Further, numeral 13 represents a shielding mechanism for temporarily intercepting the secondary beam 110 so as to prevent the secondary beam 110 from entering the MCP assembly detector 5.

The operation of the pattern inspection apparatus constructed as described above (the pattern inspection method according to the present invention) will be described in order.

Figure 8:
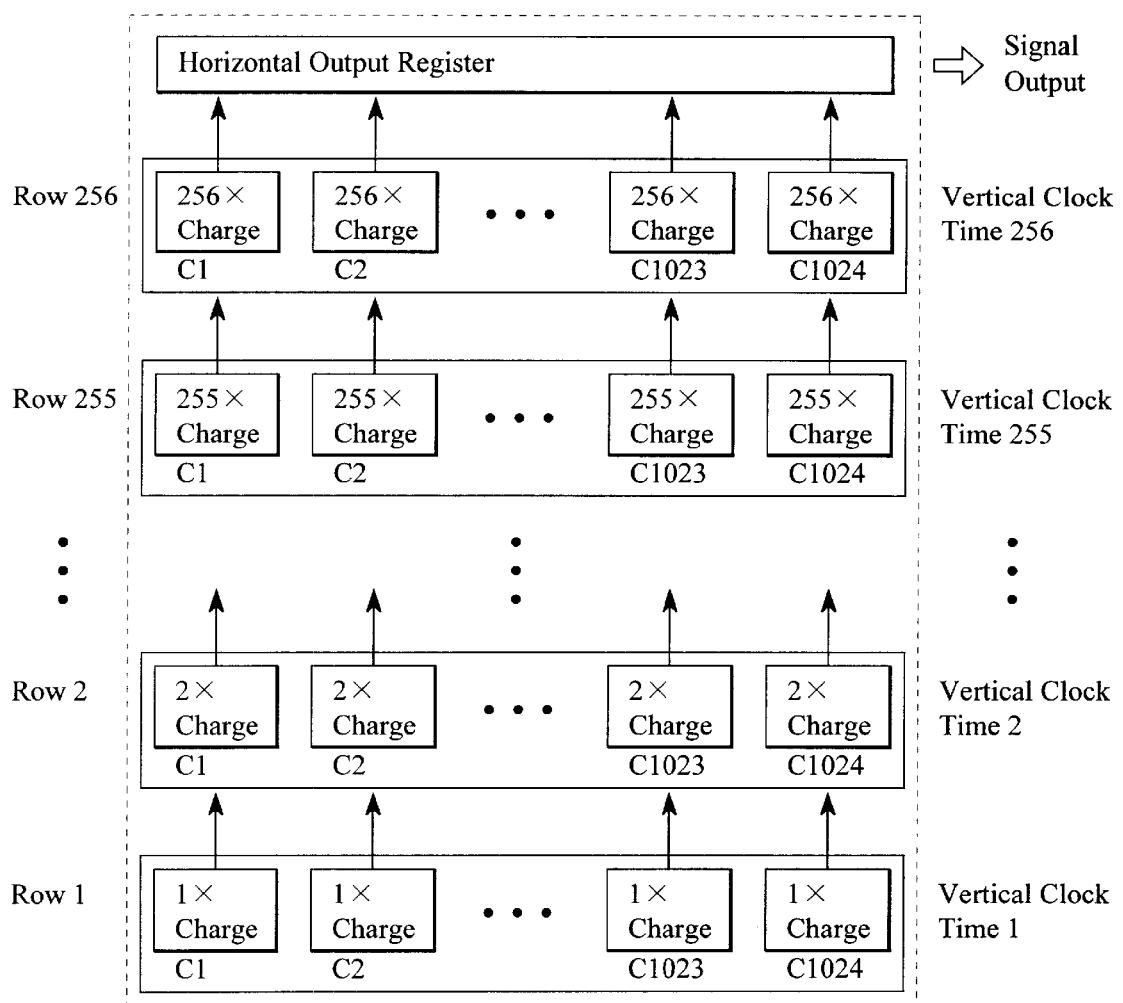
FIG. 8 is a block diagram to schematically show the structure of the CCD TDI array.

First, the CCD TDI (TDI CCD array) array will be described briefly. FIG. 8 is a block diagram to show the configuration of TDI (Time-Delay-Integration) array CCD. The CCD TDI array consists of 256 rows of ROW 1 to ROW 256 arranged vertically, each row being a linear CCD pixel array consisting of 1024 pixels of C1 to C1024 arranged horizontally. Stored charges on each CCD pixel array are arranged to be transmitted by one pixel of CCD vertically at one time by one vertical clock signal supplied from the outside. Specific known examples of this CCD TDI array are Dalsa CT-E1F2 Scan Cameras available from DALSA Inc.

Line image information (of 1024 pixels) picked up at a certain time in Row 1 is transferred to Row 2 when the sample 6 on the stage 7 moves by the distance of one pixel array in the vertical direction and a vertical clock signal is given in synchronization therewith. Since Row 2 picks up the image in the same area after the movement of one pixel (which is the area the image of which was picked up before in Row 1), the charges of the image stored in Row 2 become two times those of Row 1 stored previously. Subsequently, the same area further moves by one pixel vertically with movement of the sample 6 and a synchronous clock signal is given. Then the stored charges of Row 2 are transferred to Row 3. This Row 3 also picks up the image of the same area having been picked up in previous Row 2, and the image charges stored in the Row 3 become three times those stored in Row 1. After that, the transfer of charges and the image pickup are repeated in order up to Row 256 in accordance with movement of the sample 6; and after completion of the repetitive operation, image charges of 256 times the charges first stored in Row 1 are taken as serial image data out of a horizontal output register.

As described above, the CCD TDI array is arranged to successively transfer the picked image information (stored charges) to the next Row with movement of the sample 6 and again to pick up the image of the same area in the next Row as that having been picked up in the previous Row. Therefore, the CCD TDI array picks up a desired line image on the continuously moving sample 6 in a substantially stationary state. The scan control mechanism in this embodiment continuously moves the sample 6 (or continuously moves the stage 7) while keeping the direction of irradiation of the primary beam 100 stationary in the predetermined direction, but it may also be arranged to shift the irradiation direction of the primary beam 100 while keeping the stage 7 stationary at a predetermined position.

Since the operation described above is carried out simultaneously in each of the pixel rows, Row 1 to Row 256, it becomes possible to synchronously extract line images of the sample 6 storing 256-fold image charges line by line while shifting the two-dimensional image (1024 pixels×256 pixels) on the sample 6, projected onto the CCD TDI array, in the vertical direction (in the scan direction of sample 6).

Next, the configuration of the MCP assembly detector 5 as an electron detector will be described in detail referring to FIG. 9.

The projection type secondary column 4 projects the secondary beam 110 (the projected image beam from the sample 6) from the electron beam irradiation area on the sample 6 onto the MCP unit (microchannel unit) 300. This MCP unit 300 is composed of first and second MCPs 31, 32, and the second beam 110 is first guided into the first MCP 31. The secondary beam 110 incident into the first MCP 31 is guided via the second MCP 32 to a fluorescent screen 33 while its current is amplified in the MCP 31.

On that occasion, the potential of the electron incident surface of the first MCP 31 is set so that the acceleration voltage of the secondary beam 110 projected from the secondary column 4 achieves an optimum value of detection efficiency of MCP 31. For example, when the acceleration voltage of image beam (secondary beam 110) of the surface 60 of the sample 6 projected is −5 kV, the potential is set at −4.5 kV on the electron incident surface of the first MCP 31. By this, the secondary beam 110 is decelerated and the electron energy becomes approximately 0.5 keV.

The amplification rate of current of the secondary beam 110 is defined by a voltage placed between the first MCP 31 and the second MCP 32. For example, when 1 kV is applied, the amplification rate is $1 \times 10^4$. In order to suppress a spread of the multiplied beam from the second MCP 32, the voltage of about 4 kV is placed between the second MCP 32 and the fluorescent screen 33.

In the fluorescent screen 33 the arriving electrons are converted to photons and an output image therefrom passes through FOP (fiber optic plate) 34 to impinge on TDI camera 35 equipped with the CCD TDI array. In order to match the image size on the fluorescent screen 33 with the picked image size of the CCD TDI array, the FOP 34 is designed so that the image is projected as reduced at about 3:1 (i.e., a ratio of the area of the input surface to the area of the output surface in FOP 34 is 3:1).

The operation of the MCP assembly detector 5 will be described as to how the CPU 500 actually takes in the image of the inspection target area on the sample 6, using the constituent elements having the above functions.

FIG. 10 is a drawing for explaining the operation of the CCD TDI array upon inspection of pattern. In FIG. 10, let us suppose that the inspection target area (included in the electron beam irradiation area) 41 indicated by hatching on the surface 60 of sample (wafery 6 is inspected. On that occasion, the irradiation direction of the primary beam 100 emitted from the primary column 3 is fixed in the predetermined direction and the sample 6 on the stage 7 is continuously moved at constant speed in the direction indicated by arrow S2 in the drawing (or in the vertical direction), according to directions from the CPU 500. The image (sample image) of imaging area 40 in the surface 60 of sample 6 is properly enlarged and projected to the MCP assembly detector 5.

Now, inspection is started from the illustrated position, whereupon charges corresponding to the sample image of from the coordinates (X1, Y1) to (X1024, Y1) of the inspection target area 41 are stored in Row 1 of the CCD TDI array. When the sample 6 is vertically moved in the direction indicated by arrow S2 with movement of the stage 7, the position of the imaging area 40 also moves by one pixel, as described above. Then the laser interferometer unit 9 sends one vertical clock signal to the camera drive control system 8 for controlling the driving of CCD TDI array.

Then, the image information (stored charges) stored in Row 1 of the CCD TDI array is transferred to Row 2. Before a next clock signal is given, the sample image of from the coordinates (X1, Y1) to the coordinates (X1024, Y1) is stored in Row 2 of CCD TDI array, and the sample image of from the coordinates (X1, Y2) to (X1024, Y2) is stored in Row 1.

After that, Row 1 of the imaging area 40 comes up to the sample coordinate position from the coordinates (X1, Y256) to the coordinates (X1024, Y256) and picks up the image at that position in the same manner; thereafter, the sample image of from the coordinates (X1, Y1) to the coordinates (X1024, Y1) described above starts being outputted via the camera drive control system 8 to the CPU 500. With the next vertical clock signal the sample image of from the coordinates (X1, Y2) to the coordinates (X1024, Y2) is outputted to the CPU 500; thereafter, image information (image charges successively stored up to 256 times) is successively outputted to the CPU 500, thereby carrying out the inspection of the predetermined area in the surface 60 of sample 6.

As described above, this invention allows the electron beam emitted to the MCP unit 300 to be formed in the rectangular shape with the wide area (corresponding to 1024 horizontal pixels and 256 vertical pixels), whereby the lifetime of the MCP applied to the electron detector can be increased drastically.

The table of FIG. 11 shows an example of performance comparison of MCP unit between the first embodiment of the present invention and the conventional example.

As in the above embodiment, the present invention can lengthen the lifetime of the MCP theoretically up to approximately 256 times. However, since the CCD TDI array has a lowered aperture rate to the incident light into the CCD as compared with the normal line CCD, the overall output current of MCP needs to be increased slightly. Even with taking it into account, increase in the lifetime of approximately 200 times can be expected.

Second Embodiment

Next, the second embodiment of the pattern inspection apparatus according to the present invention will be described. The fundamental configuration of the second embodiment is the same as that of the first embodiment, but the second embodiment is arranged to use the CCD TDI array forming a part of the electron detector 5 in the frame mode, thereby permitting the sample image to be observed without moving the sample 6. This is called observation in the frame mode.

Here, the frame mode is a mode in which the CCD TDI array picks up the image of the predetermined area in the surface of sample 6 for a predetermined period, thereafter a shielding device 13 such as a mechanical shutter or an electron beam blanker temporarily intercepts the irradiation of image beam (the secondary beam 110 from the electron beam irradiation area on the sample 6) to the CCD TDI array, and all two-dimensional image information (stored charges) stored in the CCD TDI array is taken in order from Row 256 into the CPU 500. This permits the CCD TDI array to be used as an image sensor similar to the normal two-dimensional CCD. The stored charges thus taken in order line by line are stored as image information in a memory in the CPU 500 and the image information is displayed on the display 550, which will be very effective means when the operator wants to temporarily stop inspection of an area during automatic and continuous inspection of the sample 6 and to visually observe the sample image of the same area.

Since this second embodiment can decrease the current density of the electron beam (primary beam 100) emitted to the sample 6 down to about one two hundred fifty sixth without decreasing the inspection speed, the second embodiment can also be expected to achieve the effect of considerably decreasing the damage such as charge-up or contamination of the sample 6 due to the beam irradiation.

Further, the first embodiment according to the present invention is arranged so that the shape of the electron beam irradiation area on the sample 6 irradiated by the electron beam is the rectangular shape of the wide area (corresponding to 1024 horizontal pixels and 256 vertical pixels), but it is needless to mention that the shape of the electron beam irradiation area may be one of various shapes including the elliptic shapes as long as it covers the rectangular area imaged by the CCD TDI array. Accordingly, the cross section of the electron beam necessary for irradiation of the surface 60 of sample 6 can be shaped relatively easily as compared with the conventional technology, without having to form the shape of the chip (rectangular cathode) of the electron gun 1 at an extremely high aspect ratio, and thus the inspection apparatus is expected to achieve enhancement of stability and decrease of cost.

In the first embodiment described above, the same effect is achieved not only in the example for moving the sample stage during the inspection, but also in a system provided with moving mechanism 14 for horizontally moving the primary column 3 including the irradiation system for radiating the electron beam relative to the inspected surface of the sample 6 on a mechanical basis while keeping the stage 7 with the sample mounted thereon in a stationary state. In this case, the apparatus may be arranged in such a way that a deflector 20a for deflecting the primary beam is provided in the primary column 3 and deflector driver 20b controls the deflector 20a to deflect the orbit of the primary beam 100.

In each embodiment described above the detected electrons were secondary electrons, but the apparatus can also detect charged particles such as reflected electrons or back-scattered electrons.

Meanwhile, the electron beam columns used in applications as described in each embodiment above can be constructed of the electrostatic deflector and the electrostatic lens(es), and thus the main body of electron beam column can be made very small. With increase in the size of wafer becoming prominent in recent years, the size of the inspection apparatus thereof is also increasing inevitably. Instead of moving the wafer, the system may be provided with a moving mechanism capable of mechanically moving the electron beam irradiation system, thus forming the system configuration for moving the small electron beam column. This system configuration can properly decrease the external dimensions of the pattern inspection apparatus using the electron beam.

Third Embodiment

Next, the third embodiment of the pattern inspection apparatus according to the present invention will be described in detail.

Figure 12:
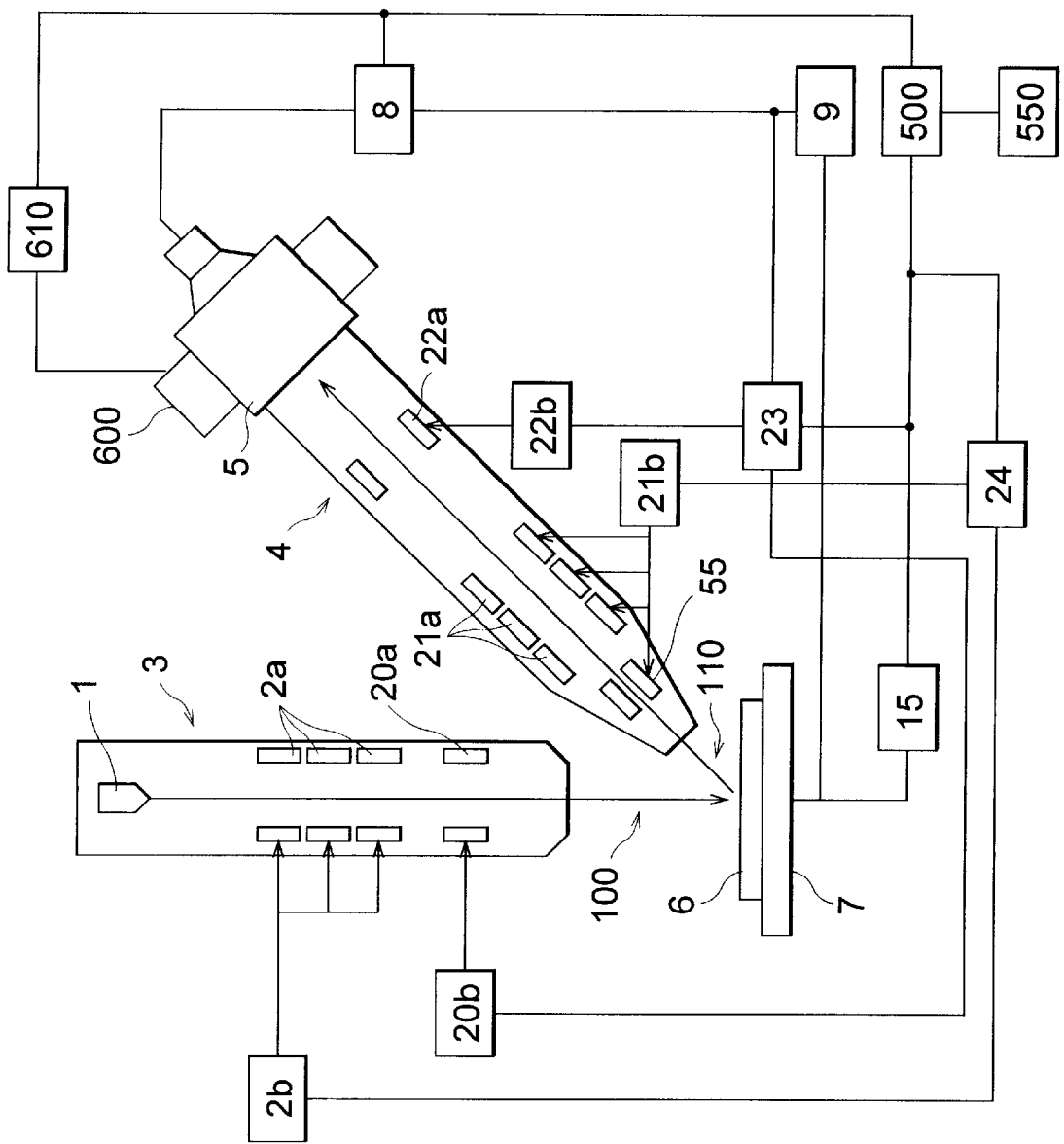
FIG. 12 is a drawing to show the configuration of the third embodiment of the pattern inspection apparatus according to the present invention.

The pattern inspection apparatus of the third embodiment is an apparatus arranged to correct positional deviation of the stage with the sample mounted thereon, thereby realizing inspection with high accuracy, and FIG. 12 is a drawing to show the configuration of the third embodiment of the pattern inspection apparatus according to the present invention. The configuration of the third embodiment is basically the same as that of the first and second embodiments described above and common components are denoted by the same reference symbols. On the plane of FIG. 12, coordinates for indicating the positional deviation of the stage 7 will be expressed by the coordinate system defined by the X-axis in the horizontal direction, the Y-axis in the direction normal to the plane of FIG. 12, and an angle θ about the Z-axis. Further, this third embodiment also has the structure in which the primary column 3 and secondary column 4 are prepared independently of each other and in which the electromagnetic prism for changing the orbit of electron beam is not provided, but it is needless to mention that the fundamental structure is the same as that of the apparatus having the Wien filter 51 shown in FIG. 3 and that the primary column and secondary column may be incorporated by applying the Wien filter.

The primary column 3 has the electron beam irradiation system comprised of the electron gun 1 and quadrupole lens system 2a for forming the rectangular electron beam and the primary beam 100 emitted from this primary column 3 drives secondary electrons 110 out of the sample 6. The secondary electrons 110 emerging from the surface of the sample 6 are captured by the projection type secondary column 4 to be projected in the form of an enlarged image to the MCP assembly detector 5 as an electron detecting system.

Figure 9:
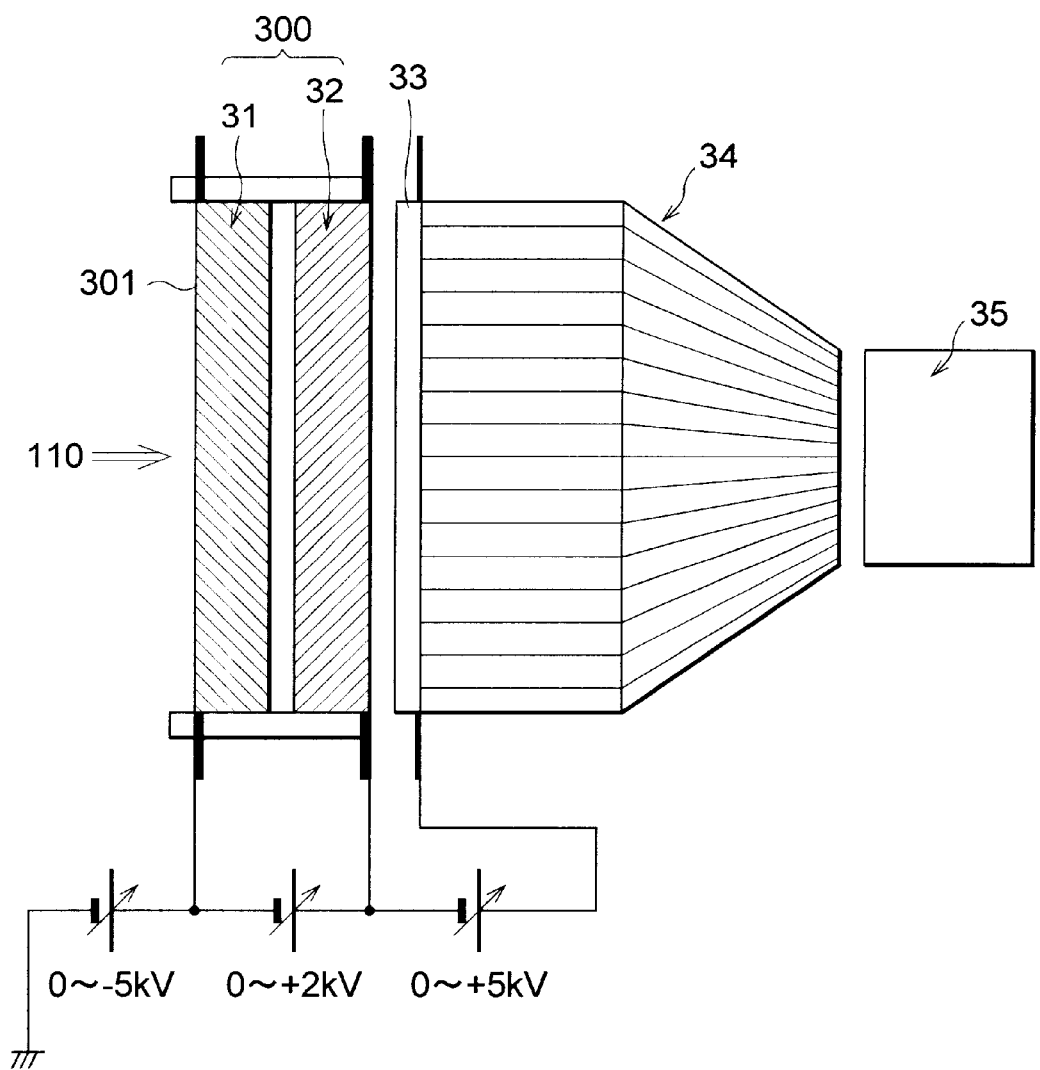
FIG. 9 is a drawing to show the configuration of the electron detecting system in the pattern inspection apparatus shown in FIG. 7.

The MCP assembly detector 5 has the CCD TDI array and electric signals corresponding to the sample image (charges stored in each row) are taken out of the CCD TDI array controlled by the camera drive control system 8, as shown in FIG. 9.

The sample 6 is mounted on the stage 7 and the stage 7 can be moved in the X-axis direction and in the Y-axis direction by the stage driver 15. The laser interferometer unit 9 as a position detector reads a position in the X-axis direction, a position in the Y-axis direction, and a rotational angle θ about the Z-axis of the stage 7.

On the other hand, the stage driver 15 moves the stage 7 according to directions from the CPU 500 and the position information is also transmitted from the laser interferometer unit 9 to the camera drive control system 8 of CCD TDI array. Electric signals concerning the sample image are successively supplied to the CPU 500 to be displayed on the display 550.

The primary beam 100 is adjusted in the position and rotational angle on the surface of sample 6 by first alignment deflector 20a. The first alignment deflector 20a is driven by first alignment deflector driver 20b.

On the other hand, the secondary electrons are adjusted in the position and rotational angle on the electron incident surface of the MCP assembly detector 5 by second alignment deflector 22a. The second alignment deflector 22a is driven by second alignment deflector driver 22b.

Further, the first and second alignment deflector drivers 20b, 22b are controlled by alignment control system 23 arranged to operate according to directions from the CPU 500, but real-time control is also possible based on the position information of stage, including the position in the X-axis direction, the position in the Y-axis direction, and the rotational angle θ about the Z-axis of the stage 7, detected by the laser interferometer unit 9.

The triple quadrupole lenses 2a adjust the shape of the electron beam irradiation area on the sample 6 irradiated by the primary beam 100. Primary-system three-output lens power supply 2b is controlled by lens control system 24 which is under control of the CPU 500. The cross section of the primary beam 100 (the shape of the electron beam irradiation area) is shaped according to directions from the CPU 500.

Four electrostatic lenses 21a of projection optical system are prepared for projecting the electron image (the image of the inspection target area) formed by the secondary beam 110 to the MCP assembly detector 5 and for focusing the electron image at a predetermined magnification on the electron incident surface of the MCP assembly detector 5. The magnification and focus position of the image on the electron incident surface of MCP assembly detector 5 are determined by an output from secondary-system four-output lens power supply 21b. The secondary-system four-output lens power supply 21b is controlled by the lens control system 24 which is under control of the CPU 500.

Since the configuration of the MCP assembly detector 5 as an electron detector is substantially the same as that in the first embodiment described above (FIG. 9), the detailed description thereof is omitted herein.

Next, the operation of the third embodiment of the pattern inspection apparatus according to the present invention will be described. The operation upon inspection of pattern in the pattern inspection apparatus of the third embodiment will also be described using FIG. 10.

In FIG. 10, let us suppose that inspection is carried out while successively acquiring the image of the line area (imaging area) 40 of from the coordinates (X1, Y1) to the coordinates (X1024, Y1) in the inspection target area (included in the electron beam irradiation area) 41 indicated by hatching in the surface 60 of the sample (wafer) 6. On that occasion, the predetermined area (electron beam irradiation area) on the sample 6 irradiated by the primary beam 100 from the primary column 3 including the electron beam irradiation system is stationary relative to the sample 6, and the sample 6 mounted on the stage 7 is continuously moved at constant speed in the vertical direction (in the direction indicated by arrow S2). The lens control system 24 and alignment control system 23 are adjusted so that the image of the imaging area 40 is properly enlarged and projected onto the electron incident surface of the MCP assembly detector 5.

When the operator gives an instruction of inspection to the CPU 500, the stage 7 is continuously moved in the direction indicated by the arrow S2 in the drawing while the irradiation direction of the primary beam 100 is kept stationary in the predetermined direction; Thus the primary beam successively irradiates the inside of the image target area 41 to start inspection. With an increment of one line address the position information of the stage 7 is transmitted from the laser interferometer unit 9 to the camera drive control system 8 and the line image of the imaging area 40 on the sample 6 is successively taken into the CPU 500, thus performing the inspection of image.

If a certain factor such as unevenness of moving speed or mechanical vibration of the stage 7 gives rise to positional deviation in the X-axis direction and positional deviation in the Y-axis direction of the stage 7, and angular deviation of θ due to rotation of stage, the laser interferometer unit 9 will read it instantaneously and the alignment control system 23 will control the first alignment deflector 20a so as to keep the imaging area 40 consistent in response to the positional and angular deviation.

At the same time, the alignment control system 23 also controls the second alignment deflector 22a so that the image of the imaging area 40 in the electron beam irradiation area formed by the secondary beam 110 of secondary electrons is properly transmitted to the TDI camera 35 on the electron incident surface of the MCP assembly detector 5, thereby correcting the positional deviation in the X-axis direction, the positional deviation in the Y-axis direction, and the angular deviation due to rotation about the Z-axis.

In this third embodiment the group of electrons detected were the secondary electrons, but the detected electrons may also be reflected electrons or back-scattered electrons. In this third embodiment the cross-sectional shape of the electron beams emitted to the sample 6 was rectangular, but the cross-sectional shape may be of another rectangle or of an ellipse different from the rectangular shape. Further, application of an electromagnetic lens will make it possible to rotate the two-dimensional image itself of the electron beam incident area 40 on the electron incident surface of MCP assembly detector 5.

In addition, the two-dimensional image on the electron incident surface of MCP assembly detector 5 can also be moved relatively by rotating the CCD TDI array 35 itself by a driving device such as a motor. In FIG. 12 reference numeral 600 designates a driving section (including a motor or the like) for moving the MCP assembly detector 5 including the CCD TDI array 35, and 610 a drive control section for outputting a drive signal to the driving section 600 according to directions from the CPU 500.

Fourth Embodiment

Next, the fourth embodiment of the pattern inspection apparatus according to the present invention will be described in detail.

Figure 13:
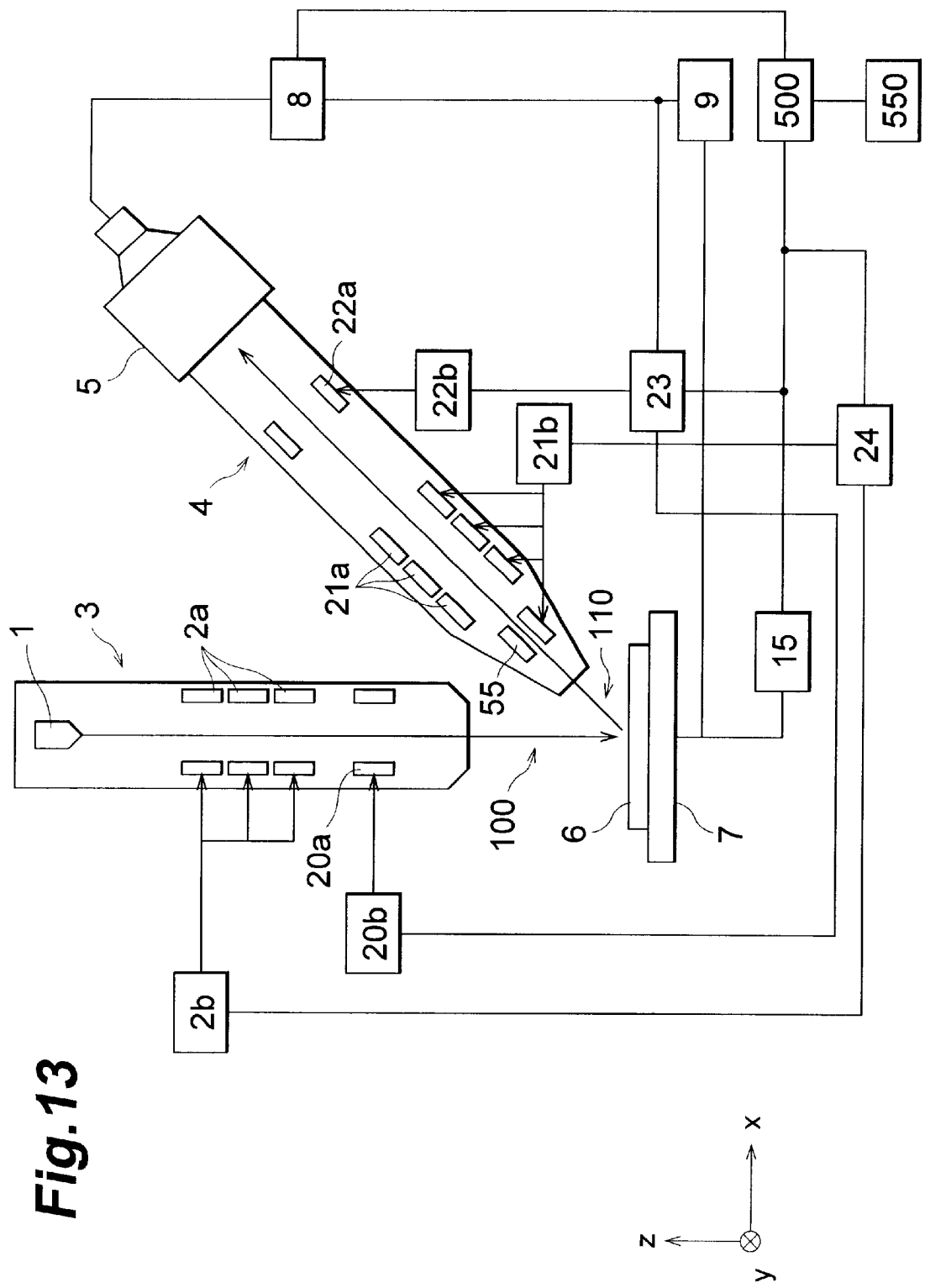
FIG. 13 is a drawing to show the configuration of the fourth embodiment of the pattern inspection apparatus according to the present invention.

The pattern inspection apparatus of the fourth embodiment is an apparatus that can increase the lifetime of MCP and allows high-speed processing at low cost, and FIG. 13 is a drawing to show the configuration of the fourth embodiment of the pattern inspection apparatus according to the present invention. The configuration of this fourth embodiment is basically the same as that of the first and second embodiments (FIG. 7) described above, and common components are denoted by the same reference symbols. On the plane of FIG. 13, the X-axis is defined in the horizontal direction, the Y-axis in the direction normal to the plane of FIG. 13, and the Z-axis in the vertical direction. Further, this fourth embodiment also has the structure in which the primary column 3 and secondary column 4 are prepared independently of each other and in which the electromagnetic prism for changing the orbit of electron beam is not provided, but it is needless to mention that the fundamental structure is substantially the same as that of the apparatus having the Wien filter 51 shown in FIG. 3 and that the primary column and secondary column may be incorporated by applying the Wien filter.

In the fourth embodiment the primary column 3 has the irradiation system consisting of the electron gun 1 and quadrupole lens system 2a for forming the rectangular electron beam and the primary beam 100 emitted from this primary column 3 drives the secondary electrons 110 out of the sample 6. The secondary electrons 110 emerging from the surface of the sample 6 are captured by the projection type secondary column 4 to be projected in the form of an enlarged image to the MCP assembly detector 5 as an electron detecting system (and to be focused at a predetermined magnification on the electron incident surface of MCP assembly detector 5).

Figure 14:
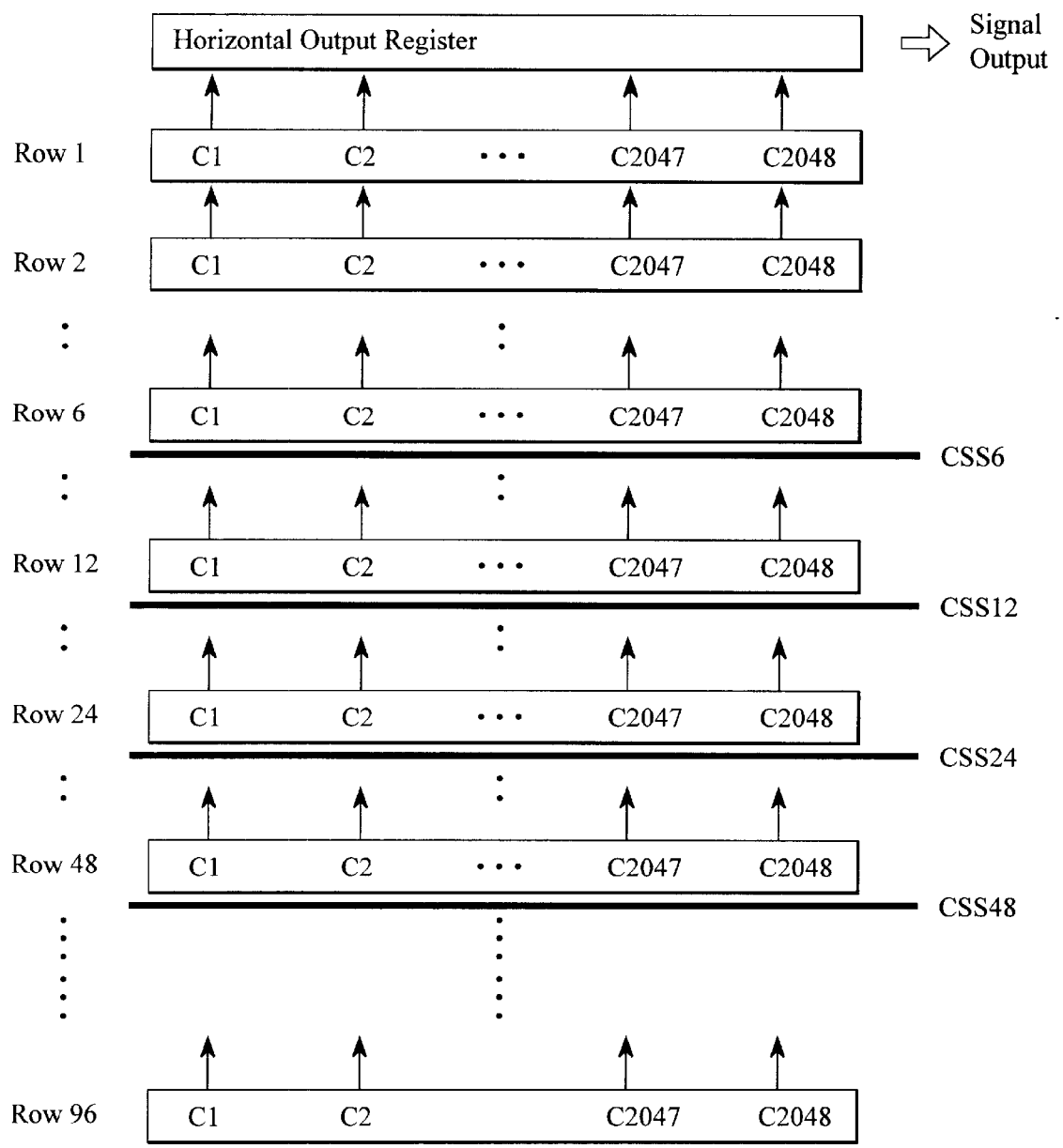
FIG. 14 is a block diagram to schematically show the structure of the CCD TDI array in the fourth embodiment.

The MCP assembly detector 5 has a 96-stage CCD TDI array of a cumulative line changeable type as shown in FIG. 14, and electric signals corresponding to the sample image are taken out of the CCD TDI array controlled by the camera drive control system 8.

The sample 6 is mounted on the stage 7 and the stage 7 can be moved in the X-axis direction and in the Y-axis direction by the stage driver 15. The laser interferometer unit 9 as a position detector reads the position in the X-axis direction, the position in the Y-axis direction, and the rotational angle θ about the Z-axis of the stage 7.

On the other hand, the stage driver 15 drives the stage 7 according to directions from the CPU 500 and the position information thereof is transmitted from the laser interferometer unit 9 to the camera drive control system 8 of the CCD TDI array. The electric signals concerning the sample image are successively supplied to the CPU 500 to be displayed on the display 550.

The operation of the defect inspection apparatus with the electron beam (the pattern inspection apparatus of the fourth embodiment) as constructed in the above structure will be described in order.

First, the CCD TDI array of the cumulative line changeable type will be described briefly. FIG. 14 is a block diagram to show the configuration of the 96-stage TDI (Time-Delay-Integration) array CCD of the cumulative line changeable type.

This CCD TDI array is composed of 96 rows of Row 1 to Row 96 arranged vertically, each row being a linear CCD stage consisting of 2048 CCD pixels of C1 to C2048 arranged horizontally. Stored charges on each CCD stage are transferred by one stage at one time in the vertical direction by one vertical clock signal supplied from the outside.

When the number of cumulative lines is set to the maximum, 96 lines, by a signal from the outside, for example, the sample image (of 2048 pixels) taken into Row 96 at a certain time is transferred to Row 95 when the sample is moved by one stage in the vertical direction and one vertical clock signal is given in synchronism therewith. Then Row 95 takes in the image of the same area after movement of one pixel (which is the area previously taken in Row 96), so that the image information stored in the Row 95 is two times the charges previously stored in Row 96. Subsequently, in Row 94, the sample 6 is further moved vertically by one stage, as described before referring to FIG. 8, and image charges three times greater are stored with a synchronous clock signal.

After that, the transfer of charges and the image pickup are successively repeated up to Row 1 with movement of sample 6, and cumulation results (image electric signals) of 96-fold image charges are taken as serial image data from the horizontal output register into the CPU 500.

The operation described above is carried out simultaneously in each of stages Row 1 to Row 96, whereby the line images of the sample 6 as a result of cumulation of 96-fold image charges can be taken out in synchronism line by line while shifting the two-dimensional image (2048 pixels×96 pixels) on the sample 6, projected onto the CCD TDI array, in the vertical direction (in the scan direction of sample 6). However, the operation is as follows when the number of cumulative lines is changed by external control. Namely, in the case of this TDI camera, the cumulative lines can be selected from five choices of 96 stages, 48 stages, 24 stages, 12 stages, and 6 stages. For example, when the cumulative lines are set to 48 stages, transferred charges are cut at the position of the line indicated by CSS 48 in the drawing. Namely, in the case of 48-stage setting, rows actually contributing to image pickup are limited to Row 1 to Row 48. In the case of the other stage-number setting, the transferred charges are cut at a position indicated by CSS 24, CSS 12, or CSS 6, depending upon the number of stages.

As for the MCP assembly detector 5 as an electron detector, the structure of the MCP assembly detector 5 in this fourth embodiment is substantially the same as the structure of the first to third embodiments described above (FIG. 9) and the description thereof is thus omitted in this embodiment.

Next described is how the sample image is actually taken into the CPU 500, using the components having the above functions. The fundamental operation will be described using FIG. 10.

In FIG. 10, let us suppose that inspection is carried out for the inspection target area (included in the electron beam irradiation area) 41 indicated by hatching in the surface 60 of sample (wafer) 6. It is assumed that the sample 6 is continuously moved at constant speed in the vertical direction (in the direction indicated by the arrow S2 in the drawing) according to directions from the CPU 500. It is also assumed that the linear image beam (secondary beam 110) in the imaging area 40 on the sample 6 irradiated by the primary beam 100 is properly projected in the form of an enlarged image onto the electron incident surface of the MCP assembly detector 5.

Now, inspection is started from the position indicated in FIG. 10, whereupon the sample image of from the coordinates (X1, Y1) to the coordinates (X2048, Y1) of the inspection target area 41 is taken into Row 96 of the CCD TDI array and image charges are stored therein. When the imaging area 40 moves by a distance of one pixel in the direction indicated by the arrow S2 with vertical movement of the sample 6, the laser interferometer unit 9 sends one vertical clock signal to the camera drive control system 8 of the CCD TDI array.

Then, the image charges stored in Row 96 of CCD TDI array are transferred to Row 95. Before the next clock is given, the sample image of from the coordinates (X1, Y1) to the coordinates (X2048, Y1) is taken into Row 95 of CCD TDI array and the sample image of from the coordinates (X1, Y2) to the coordinates (X2048, Y2) into Row 96.

After that, the operation is continued in the same way; when Row 96 of CCD TDI array finishes pickup of the sample image of from the coordinates (X1, Y96) to the coordinates (X2048, Y96), the image electric signals (stored charges) of the sample image of from the coordinates (X1, Y1) to the coordinates (X2048, Y1) first start being outputted via the camera drive control system 8 to the CPU 500. Subsequently, the sample image of from the coordinates (X1, Y2) to the coordinates (X2048, Y2) is outputted to the CPU 500 with the next vertical clock signal; thereafter image electric signals will be taken successively into the CPU 500, thus accomplishing the inspection.

Figure 15:
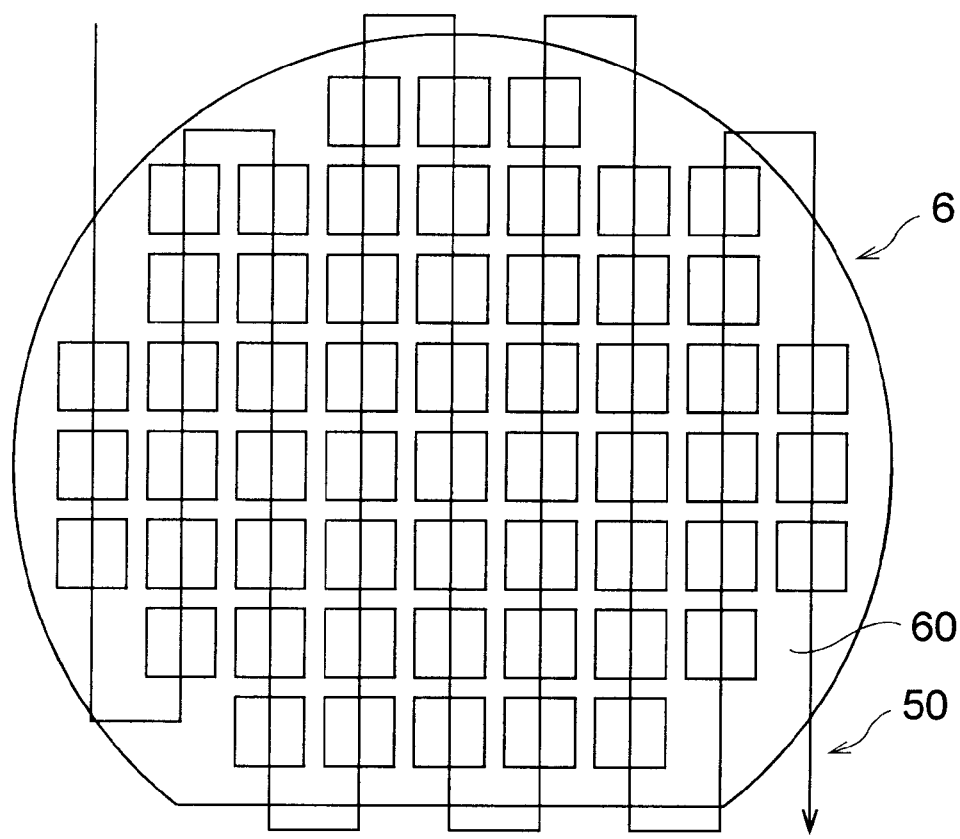
FIG. 15 is a drawing for explaining the moving motion of the stage upon inspection of pattern.

FIG. 15 shows the flow of inspection observed from above the surface 60 of the whole inspection target wafer (sample 6). In the drawing the movement locus of the electron beam irradiation area with movement of the stage 7 is indicated by arrow 50. As illustrated in this figure, the highest process speed is achieved by such an inspection sequence that after inspection is completed by continuous movement of the stage 7 in one direction, the moving direction of the stage 7 is inverted in the next inspection.

Since the cumulation direction of CCD TDI array cannot be changed in the fourth embodiment, the fourth embodiment thus adopts a means for inverting mapping inside the projection type secondary column 4.

Figure 16:
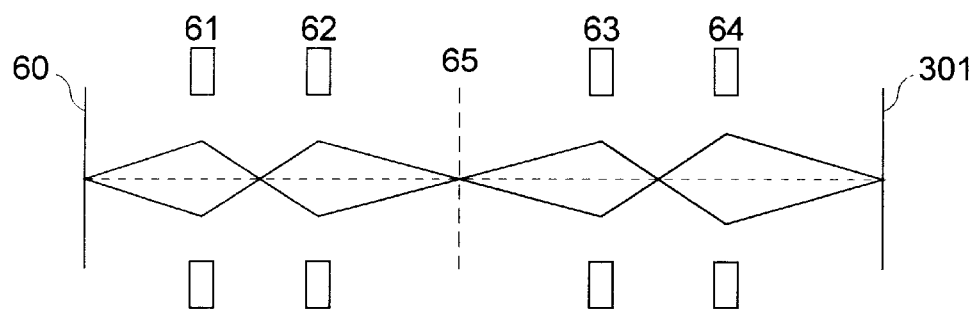
FIG. 16 and FIG. 17 are drawings for explaining mapping focusing modes.
Figure 17:
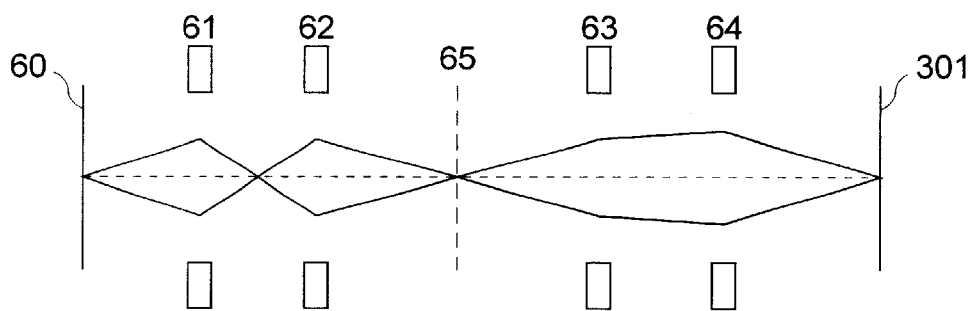

FIGS. 16 and 17 are schematic ray diagrams in image-forming modes for changeover between regular erection and inversion of mapping.

For inverting mapping, the number of image formations by the electrostatic lenses is increased or decreased by one. The lens configuration is preliminarily designed so as to properly absorb a magnification difference appearing on that occasion.

FIG. 16 is a drawing for conceptually explaining the mode for forming an erect sample image of the sample placed on the sample surface, on the surface of MCP detector. By cathode lens 61 and transfer lens 62, the electron image of the sample surface 60 is focused at a certain magnification on the surface of field stop 65. Further, the electron image of the sample 6 is focused on the electron incident surface 301 of MCP by rear-stage first projection lens 63 and second projection lens 64.

On the other hand, FIG. 17 shows a configuration in which the number of image formations is decreased by one by changing the applied voltage to the first projection lens 63 and to the second projection lens 64. Accordingly, the image formation of FIG. 17 results in obtaining an inverted image of FIG. 16. The magnification is adjusted by adjusting the voltages applied to the respective lenses.

The method as described above permits the inspection in the flow shown in FIG. 15 to be carried out without using a TDI camera capable of cumulating images in two directions.

As described above, the first and second embodiments according to the present invention can expand the use area of MCP to 256 times the area in the conventional technology, so that the lifetime of MCP can be extended to 256 times longer under the same conditions of the output current of MCP.

When the use area becomes 256 times greater under the condition of the same output current of MCP, the current density becomes one two hundred fifty sixth. However, use of the CCD TDI array allows the same image to be taken 256 times. Accordingly, S/N ratios of sample image obtained can be equivalent to those by the conventional technology, whereby the high-sensitivity detection performance can be maintained.

Further, since the present invention can employ the CCD TDI array capable of achieving the data speed almost equal to that of the linear image sensor (line CCD) as in the conventional technology, the invention can succeed to the features thereof even in the high-speed process performance.

The third embodiment according to the present invention, as described above, permits image correction in real time even if there occurs the positional deviation in the X-axis direction, the positional deviation in the Y-axis direction, and the angular deviation of angle θ about the Z-axis of the stage upon movement thereof. This prevents the sample image to be inspected from becoming imperfect and allows the inspection of patterns or the like on the wafer to be carried out with accuracy.

Further, the fourth embodiment according to the present invention can make the number of cumulative lines in the TDI camera selectable, which enables the current of primary beam to be optimized to some extent according to the surface condition of sample and the quality of material of surface. Accordingly, the fourth embodiment can minimize the damage of charge-up, contamination, or the like in the surface of sample.

In addition, even though the special CCD TDI array and camera drive control system should be developed so as to permit the apparatus to select an optimum pixel configuration and an optimum configuration of the number of cumulative lines, the fourth embodiment can be arranged by the single-direction TDI method and thus can greatly decrease the cost for development. For example, it is easy to design the highest possible number of TDI cumulative lines to be 512 lines and to select one number from 512, 256, 128, 64, 32, 16, and 8. This makes it possible to develop an apparatus realizing stable and quick inspection at low cost.

Although the fourth embodiment adopts the structure for enabling the image to be inverted by adjustment of the voltages applied to the electrostatic lenses, as the inverting means of mapping, it is needless to mention that the inverting means may be another rotating means such as image rotation by deflector or image rotation by electromagnetic lens. Since mapping can be rotated 180° upon turn of the stage, the same processing speed as in the case employing the two-way TDI camera can be achieved even in use of the single-way TDI camera. Further, since the fourth embodiment can employ the TDI camera permitting the number of cumulative lines to be set variably, it becomes possible to optimize the number of cumulative lines in the TDI camera and the quantity of primary electron beam, depending upon the circumstance.

Next, the inspection apparatus according to fifth and sixth embodiments will be explained.

As mentioned above, when the sample image projected onto the image pickup surface shifts on the detection surface as the stage moves, the CCD TDI array (TDI CCD image sensor) transfers, in synchronization with the movement of the stage, the signal charges being stored, thereby storing the signal charges in the same portion of the sample image.

If the movement of the stage and the transfer of signal charges are not synchronized with each other, however, the signal charges will be added to each other between different portions of the sample image, whereby the image quality will deteriorate. Namely, if speed fluctuations, sidewise shifting, vibrations, and the like occur in the stage when it is moved, the stage position will shift, whereby the sample image will be projected onto the detection surface of the CCD TDI array at a position dislocated from its original position. When the signal charge transfer is carried out in this state, then charges are stored while the sample image is in a shifted state, whereby the sample image would blur, thus remarkably lowering the sharpness of the image.

Therefore, the movement of the stage is driven and controlled at a constant speed with a high precision so as to avoid vibrations, sidewise shifting, and the like. However, it is very difficult to drive and control a conventional stage at a constant speed while completely suppressing its vibrations. Hence, speed fluctuations, vibrations, and the like exist more or less.

For example, the tolerance of speed fluctuations in the CCD TDI array of DALSA Inc. is ±1%. As a consequence, the stage control must be carried out such that the speed fluctuations are within the range of ±1%. For realizing this, there are measures such as making the stage an air guide type, making the motor a linear motor, and the like, which cause the stage to become more expensive, however. Also, even when these devices are provided, it is necessary to correct minute vibrations of the stage, thus making it essential to prevent the image quality from deteriorating.

The inspection apparatus according to the fifth and sixth embodiments explained in detail in the following comprise a structure which keeps the image quality from deteriorating due to fluctuations in synchronization between the stage movement and the signal charge transfer and enables vivid images to be acquired.

Fifth Embodiment

Figure 18:
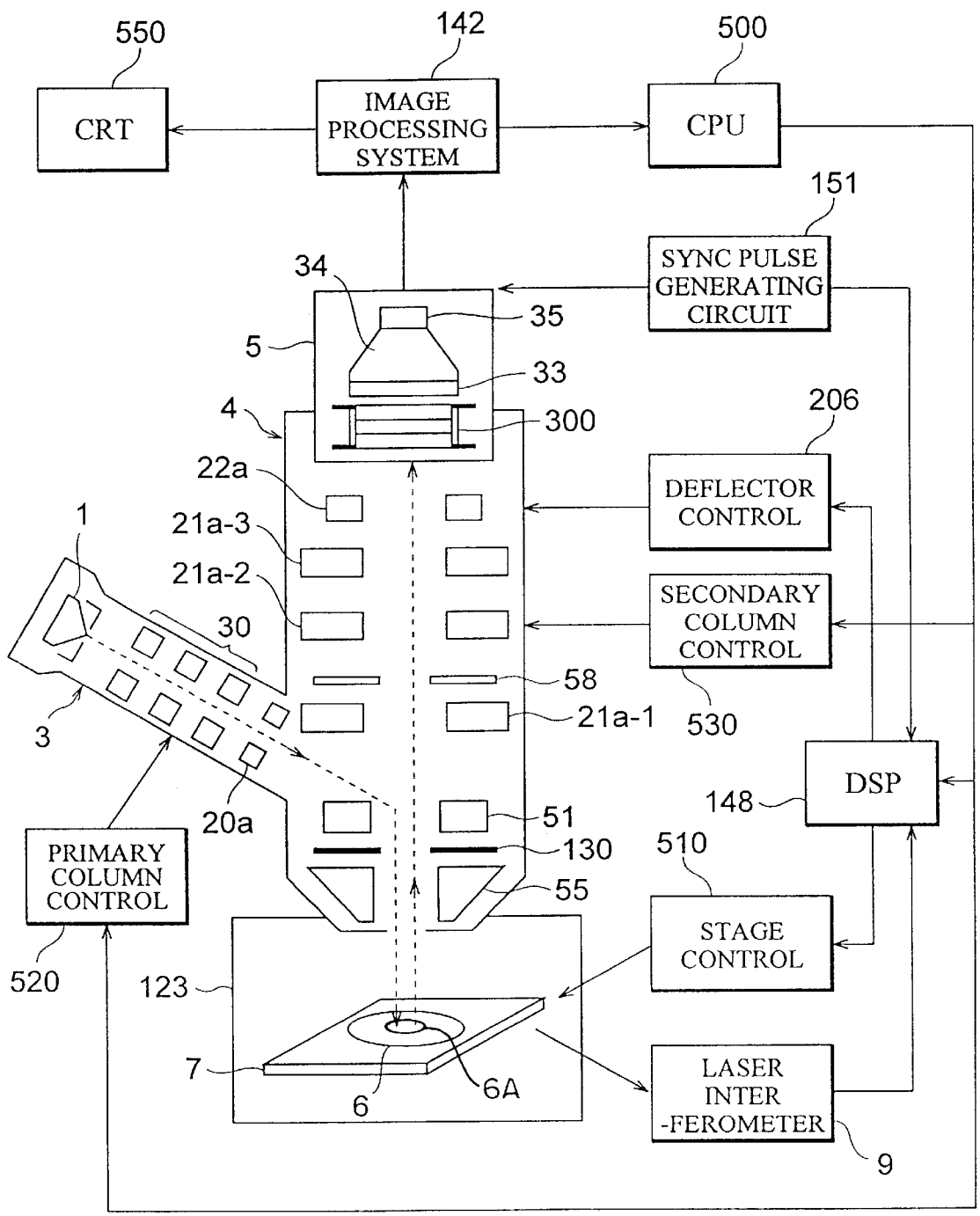
FIG. 18 is a drawing to show the configuration of the fifth embodiment (electron beam inspection apparatus) according to the present invention.

FIG. 18 is a drawing to show the configuration of the fifth embodiment of the inspection apparatus (electron beam inspection apparatus) according to the present invention.

In FIG. 18, the inspection apparatus according to the fifth embodiment comprises a primary column 3, a secondary column 4, and a chamber 123. The primary column 3 is obliquely attached to a side face of the secondary column 4, whereas the chamber 123 is disposed below the secondary column 4.

Within the primary column 3, an electron gun 1 is disposed, whereas a primary optical system 30 and a deflector 20*a* are placed on the optical axis of an electron beam (primary beam) emitted from the electron gun 1.

Within the secondary column 4, a cathode lens 55, an aperture stop 130, a Wien filter 51, a second lens 21*a*-1, a field stop 58, a third lens 21*a*-2, a fourth lens 25*a*-3, a deflector 22a, and a detector (MCP assembly detector 5) are disposed on the optical axis of a secondary beam generated by a sample 6. Here, the cathode lens 55 and the second lens 21a-1 to fourth lens 22a-3 constitute a secondary optical system.

Also, a CPU 500 is connected to a primary column control system 520, a secondary column control system 530, and a DSP 148.

The primary column control system 520 controls the lens voltage of the primary optical system 30 and the current (or voltage) supplied to the deflector 20a, whereas the secondary column control system 530 controls the respective lens voltages of the cathode lens 55 and second lens 21a-1 to fourth lens 21a-3.

The output terminals of the DSP 148 are connected to respective input terminals of a deflector control system 20b and a stage control system 510, whereas the input terminals of the DSP 148 are connected to respective output terminals of a laser interferometer system 9 and a synchronization pulse generating circuit 151.

The deflector control system 20b controls the current (or voltage) supplied to the deflector 22a; the stage control system 510 drives a stage 7 in X-Y directions; and the laser interferometer system 9 outputs to the DSP 148 a pulse signal corresponding to the amount of movement of the stage 7. The synchronization pulse generating circuit 151 supplies a TDI synchronization signal to the CCD TDI array 35.

The primary column 3, the secondary column 4, and the chamber 123 are connected to a vacuum exhaust system (not shown), so as to be evacuated by a turbo pump of the vacuum exhaust system, whereby a vacuum state is maintained in their inside.

An operation of acquiring a sample image in the electron beam inspection apparatus according to the fifth embodiment will now be explained.

Figure 19:
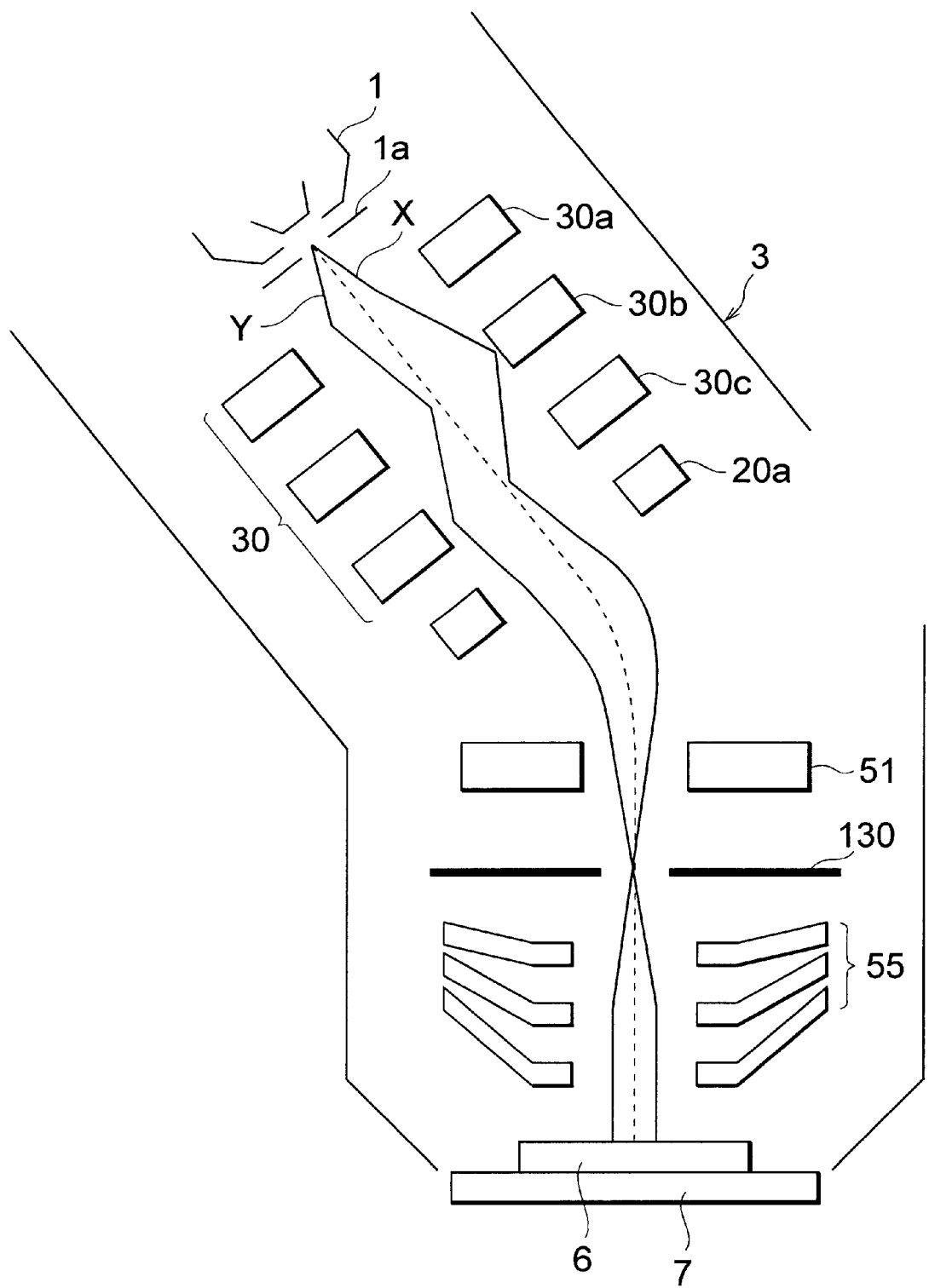
FIG. 19 is a drawing to show orbits of a primary beam.

As shown in FIG. 19, the primary beam emitted from the electron gun 1 is accelerated by the acceleration voltage of the electron gun 1 and is made incident on the center of the Wien filter 51 while being subjected to the lens action of the primary optical system 30 and the deflecting action of the deflector 20a.

FIG. 19 shows the respective orbits of electrons released to X- and Y-axial cross sections of a rectangular cathode.

The primary beam shaped into a rectangular form by the primary optical system 30 is deflected by the deflector 20a so as to be made incident on the center portion of the Wien filter 51. The orbit of the primary beam incident on the Wien filter 51 is bent by the deflecting action of the Wien filter 51, so as to form an image at the opening portion of the aperture stop 130. The Wien filter 51 is a deflecting device in which, letting the magnetic field be perpendicular to the electric field, E be the electric field, B be the magnetic field, and v be the velocity of a charged particle, only charged particles satisfying the Wien condition of E=vB are allowed to travel straight and the orbits of the other charged particles are bent.

The aperture stop 130 corresponds to an aperture stop and determines the aperture angle of the cathode lens 55. The aperture stop 130 is shaped into a thin film sheet made of a metal (Mo or the like) having a circular hole, and inhibits unnecessary electron beams scattered within the apparatus from reaching the sample surface, thereby preventing the sample 6 from being charged up or being contaminated.

The primary beam having formed an image at the opening portion of the aperture stop 130 vertically irradiates the surface of the sample 6. When the sample surface is irradiated with the primary beam, the area thus irradiated with the beam generates a secondary beam including at least one of secondary and reflected electrons.

Hence, the secondary beam has two-dimensional image information of the beam-irradiated area. In particular, since the primary beam vertically irradiates the sample 6, the secondary beam can have a vivid image without shadows.

Figure 20:
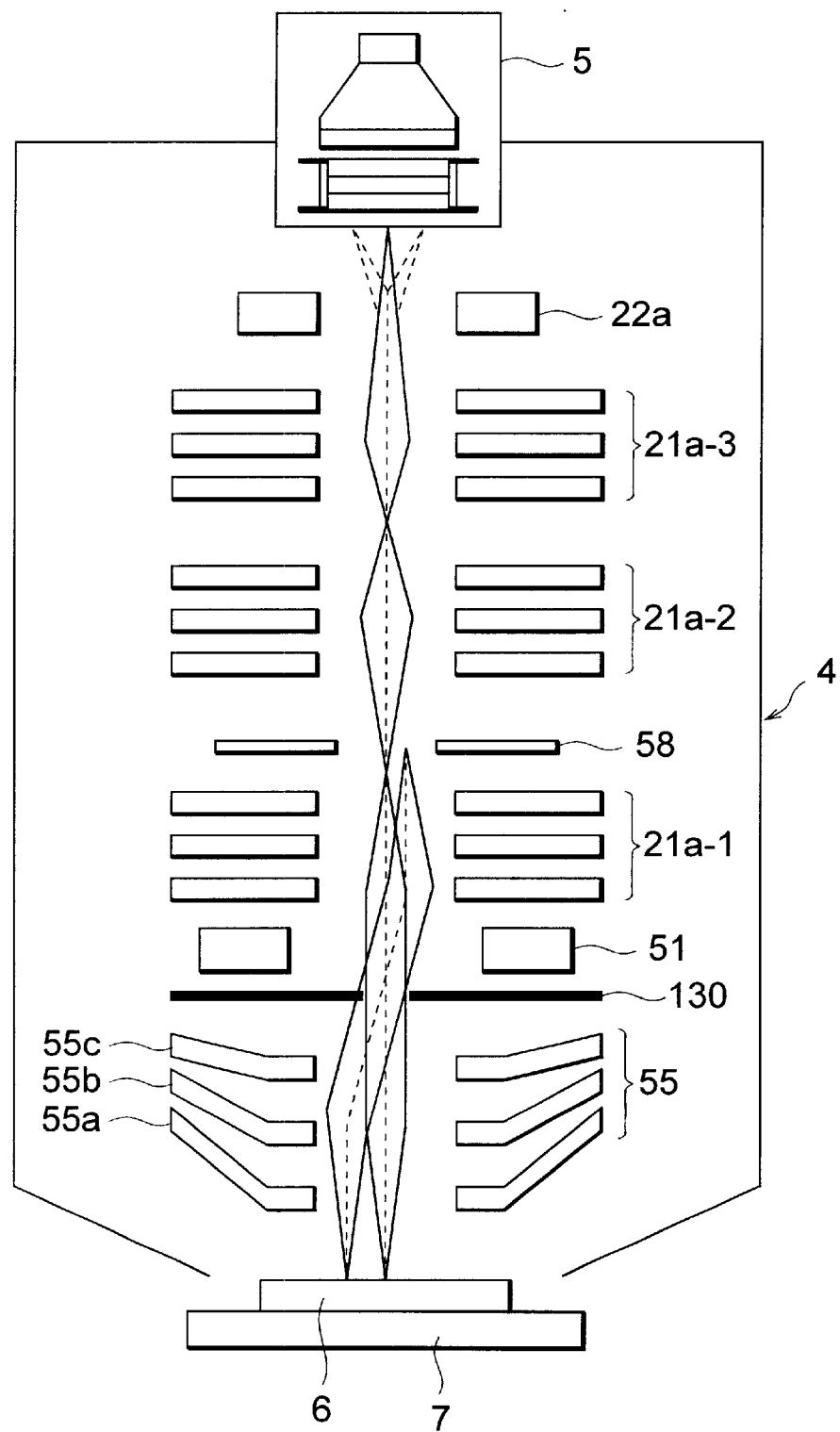
FIG. 20 is a drawing to show orbits of a secondary beam.

As shown in FIG. 20, on the other hand, the secondary beam is subjected to a converging action by the cathode lens 55. Usually, the cathode lens 55 is constituted by two to four electrode sheets. The fifth embodiment shows an example of configurations with three electrode sheets (55a, 55b, 55c). Usually, for making them function as a lens, a voltage is applied to the first and second electrodes 55a and 55b from below in the cathode lens 55, whereas the third electrode 55c is set to zero potential.

A voltage (retarding voltage) is applied to the stage 7, whereby a negative electric field and a positive electric field are formed with respect to the primary and secondary beams, respectively, between the electrode 55a and the sample surface.

Due to the retarding voltage, the cathode lens 55 decelerates the primary beam so as to prevent the sample 6 from being charged up or being broken, and accelerates the secondary beam (draws in electrons, secondary electrons having a low directivity in particular), thereby acting to guide the secondary beam efficiently into the lens.

The secondary beam passed through the cathode lens 55 and aperture stop 130 travels straight without being subjected to the deflecting action of the Wien filter 51. Here, changing the electric and magnetic fields applied to the Wien filter can guide, from the secondary beam, only electrons (e.g., secondary or reflected electrons) having a specific energy band into the MCP assembly detector 5.

Also, the aperture stop 130 acts to suppress lens aberrations of its downstream second lens 21a-1 to fourth lens 21a-3 with respect to the secondary beam.

Meanwhile, if the secondary beam is made to form an image by the cathode lens 55 alone, the lens action will be so strong that aberrations are likely to occur. Therefore, the second lens 21a-1 is used together therewith, so as to carry out a first image forming operation. Due to the cathode lens 55 and the second lens 21a-1, the secondary beam forms an intermediate image on the field stop 58.

While a lens for projecting the intermediate image is disposed downstream, two lenses consisting of the third lens 21a-2 and fourth lens 21a-3 are further provided in the fifth embodiment in order to secure a projection magnification necessary for the secondary optical system. The secondary beam forms respective images due to the third lens 21a-2 and the fourth lens 21a-3. In the fifth embodiment, three images are formed in total. Here, a single image may be formed by the combination of the third lens 21a-2 and fourth lens 21a-3 (so that two images are formed in total).

Each of the second lens 21a-1 to fourth lens 21a-3 is a lens of a type symmetrical about an axis of revolution, which is known as unipotential lens or Einzel lens. Each lens is constituted by three electrode sheets. Usually, the outer two electrodes are set to zero potential, while the voltage applied to the center electrode is changed, so as to control the lens action.

The field stop 58 is disposed at the position where the intermediate image is formed. As with a field stop of an optical microscope, the field stop 58 restricts the field of view to a necessary range. In the case of electron beams in particular, unnecessary beams are blocked by the field stop 58 in cooperation with the third lens 21a-2 and fourth lens 21a-3 downstream thereof, so that the detector 5 is prevented from being charged up or being contaminated.

The secondary beam is repeatedly converged and diverged by the third lens 21a-2 and fourth lens 21a-3, and forms an image again on the detection surface of the detector 5, whereby the image of the beam-irradiated area is projected onto the detection surface.

The deflector 22a, which will be explained later in detail, is a deflector for correcting the positional deviation of the image projected onto the detection surface.

The optical image is photoelectrically converted by the CCD TDI array 35. According to the TDI synchronization pulse signal of the synchronization pulse generating circuit 151, the CCD TDI array 35 transfers signal charges to an image processing system 142. The image pickup operation of the CCD TDI array 35 will be explained later.

The image processing system 142 A/D-converts the read-out signal charges, stores thus converted signal charges into a VRAM therewithin, so as to prepare a sample image, and causes a CRT 550 to display the sample image. Also, the CPU 500 executes template-matching and the like with respect to thus prepared sample image, thereby specifying defective portions of the sample.

The synchronization pulse generating circuit 151 outputs synchronization pulse signals to the CCD TDI array 35 and DSP 148.

Referring to FIG. 8, upon receiving a synchronization pulse signal, the DSP 148 outputs a driving control signal to the stage control system 510, whereby the latter drives the stage 7 in Y-axis direction. Then, the beam-irradiated area moves in the scanning direction by one horizontal scanning line of the CCD TDI array 35. Though FIG. 8 shows a CCD TDI array in which one line is constituted by 1024 CCDs, a CCD TDI array in which one line is constituted by 512 CCDs will be explained in the following.

The CCD TDI array 35 into which the synchronization pulse signal from the synchronization pulse generating circuit 151 has been fed transfers the signal charges stored in Row 1 to Row 2. Here, since signal charges have already been stored in Row 2 as it has picked up the image of from the coordinates (X1, Y1) to the coordinates (X512, Y1), the signal charges transferred from Row 1 would be stored in addition thereto. Also, at this time, the image of from the coordinates (X1, Y2) to the coordinates (X512, Y2) is picked up by Row 1, so that signal charges are newly stored therein.

Further, when the stage control system 510 drives the stage 7 by one horizontal scanning line in response to the synchronization pulse signal of the synchronization pulse generating circuit 151, the image of from the coordinates (X1, Y1) to the coordinates (X512, Y1) is picked up by Row 3, so that signal charges are stored therein.

As the synchronization pulse signal is fed into the CCD TDI array 35, the signal charges transferred from Row 2 are stored in Row 3 in an adding fashion. On the other hand, while signal charges have already been stored in Row 2 since it has picked up the image of from the coordinates (X1, Y2) to the coordinates (X512, Y2), the signal charges transferred from Row 1 are stored into Row 2 in an adding fashion when the above-mentioned synchronization pulse signal is fed therein. Also, the image of from the coordinates (X1, Y3) to the coordinates (X512, Y3) is picked up by Row 3, so that signal charges are newly stored therein.

As the stage 7 is thus successively driven in Y-axis direction, the sample 6 is scanned with the beam-irradiated area. In response to the driving of the stage 7, the CCD TDI array 35 successively transfers stored signal charges from one row to its adjacent row. When this operation is repeated so that the image of from the coordinates (X1, Y256) to the coordinates (X512, Y256) is picked up and its signal charges are stored in Row 1, the signal charges corresponding to the line image of from the coordinates (X1, Y1) to the coordinates (X512, Y1) would be stored in Row 256 as additions are carried out by the number of horizontal scanning lines.

When the synchronization pulse signal is fed into the CCD TDI array 35 in this state, then the signal charges stored in Row 256 are transferred to a CCD shift register via a transfer gate (not shown), and are taken out from the CCD TDI array 35 for each horizontal scanning line, so as to be transferred to the image processing system 142.

The image processing system 142 A/D-converts the signal charges successively transferred thereto and stores thus converted signal charges into the VRAM, thereby generating the image of the portion on the sample 6 scanned with the beam-irradiated area.

Subsequently, while the stage 7 is being moved in a similar manner, images of adjacent individual portions on the sample 6 are picked up by the CCD TDI array 35, whereby an image of the whole surface of the sample 6 is picked up.

Since the CCD TDI array 35 thus picks up images while shifting the signal charges in conformity with the movement of the stage 7, it can carry out the movement of the stage 7 and the image pickup operation in parallel, thus being capable of picking up the image of the whole surface of the sample in a very short time. Also, since the CCD TDI array 35 can sum up the signal charges at the same portion by carrying out additions by the number of the horizontal scanning lines, it can improve the S/N of the image.

Meanwhile, in this image pickup operation by the CCD TDI array 35, it is necessary to synchronize the movement of the stage 7 by the stage control system 510 with the charge transfer by the CCD TDI array 35 as mentioned above. For example, if speed fluctuations, sidewise shifting, vibrations, and the like occur in the stage 7, a positional deviation will occur in the sample image projected onto the image pickup surface (detection surface) of the CCD TDI array 35, whereby signal charges will be summed up between different portions of the image and, as a consequence, the sharpness of the image will deteriorate remarkably. Therefore, when a positional deviation of the stage and its accompanying positional deviation of the sample image on the image pickup surface occur, then corrections for these positional deviations are carried out.

In the following, an operation of correcting positional deviations will be explained with reference to drawings.

Figure 21:
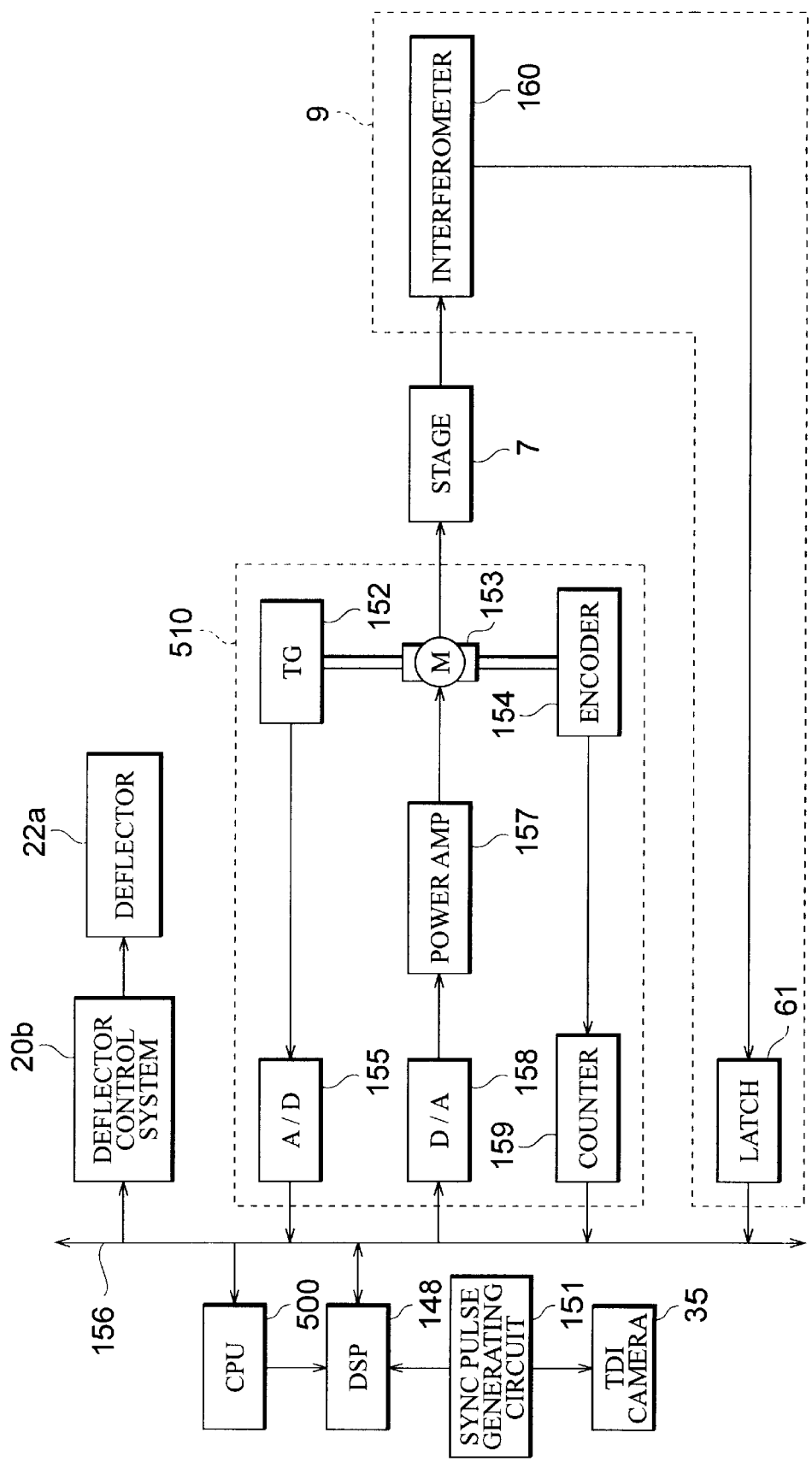
FIG. 21 is a block diagram to show the schematic configuration of a correction system which corrects positional deviations.

FIG. 21 is a block diagram to show the schematic configuration of a correction system. In FIG. 21, a motor 153 is disposed within the stage control system 510, whereas a TG (tachometric generator) 152 and an RE (rotary encoder) 154 are directly connected to both ends of the motor 153, respectively.

The TG 152 outputs an analog voltage signal in proportion to the amount of rotation of the motor 153. On the other hand, the RE 154 counts pulse signals generated in response to the rotation of the motor 153, thereby outputting a digital signal proportional to the rotational speed.

The TG 152 is connected to a bus 156 via an A/D converter 155. The bus 156 is connected to a power amplifier 157 via a D/A converter 158, whereas the power amplifier 157 is connected to the motor 153. The RE 154 is connected to the bus 156 via a counter 159.

Figure 22:
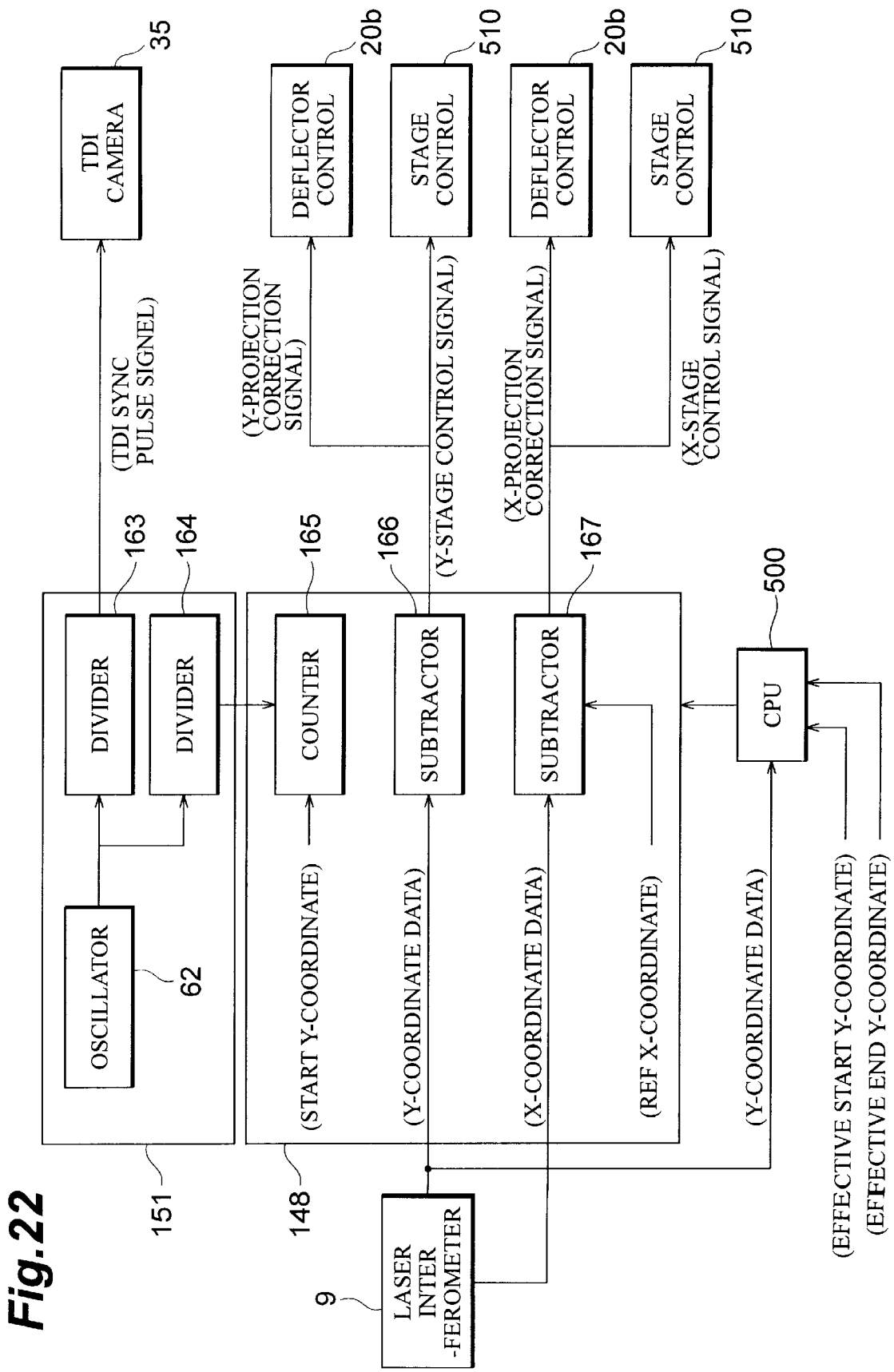
FIG. 22 is a block diagram to show the schematic configuration of the DSP in the inspection apparatus of the fifth embodiment shown in FIG. 18.
Figure 23:
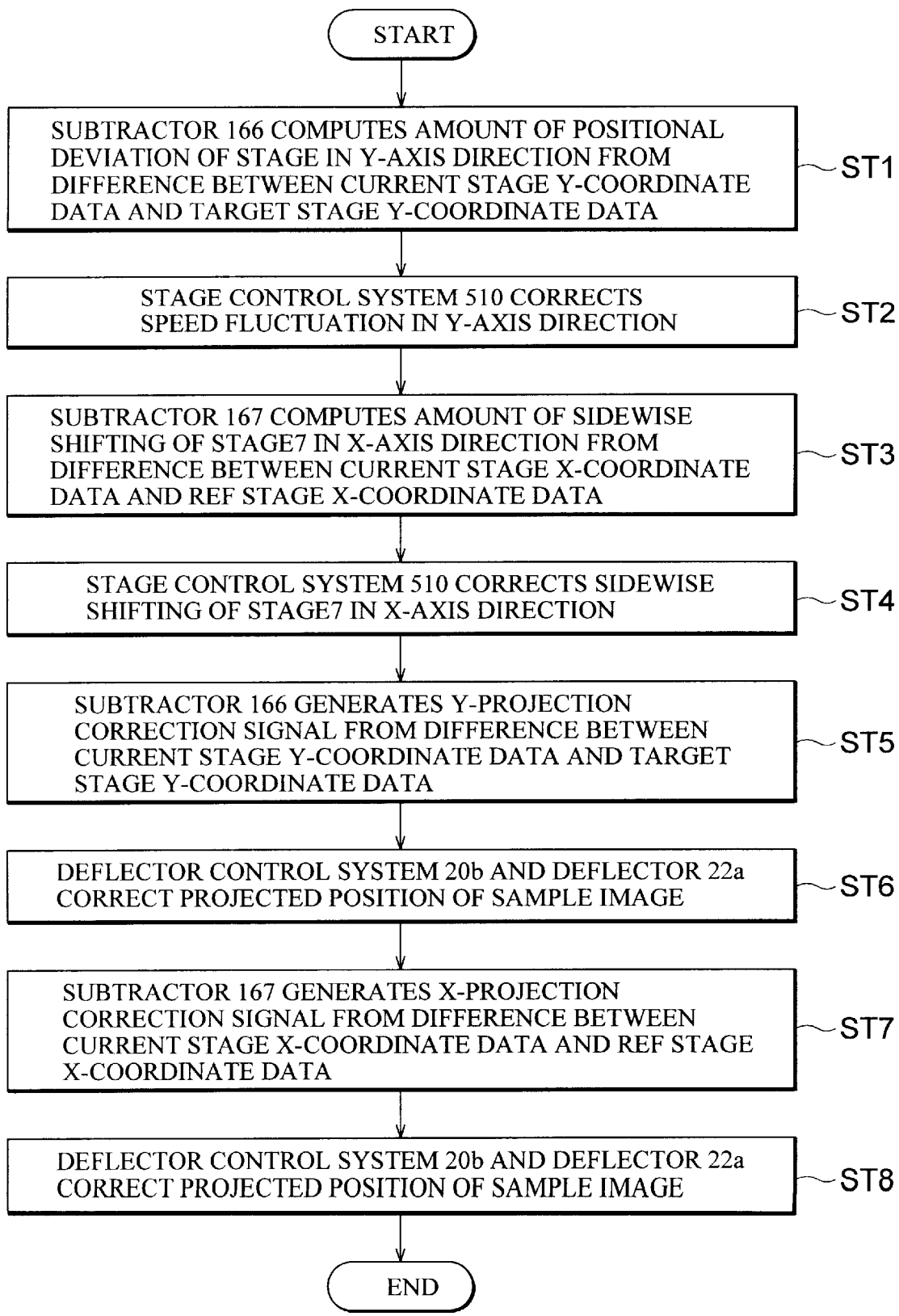
FIG. 23 is a flowchart for explaining a positional deviation correcting operation.

FIG. 22 is a block diagram to show the schematic configuration of the DSP 148, whereas FIG. 23 is a flowchart for explaining an operation of correcting positional deviations. In the following, the positional deviation correction in the fifth embodiment will be explained with reference to FIGS. 21 to 23.

In FIG. 22, the current Y-coordinate data of the stage 7 are fed into the CPU 500 from the laser interferometer system 9. If the current Y-coordinate data of the stage 7 are within the range of from an effective start Y-coordinate to an effective end Y-coordinate, then the CPU 500 determines that "the correction operation is possible" and outputs an operation start command to the DSP 148. If the data are not within the above-mentioned range, then the CPU 500 determines that "the correction operation is impossible" and outputs an operation stop command to the DSP 148.

A divider 163 divides the base clock of an oscillator 62, so as to prepare a TDI synchronization pulse signal which is determined by the velocity of the stage 7 and the pixel size of the CCD TDI array 35 (TDI camera).

On the other hand, a divider 164 divides the base clock of the oscillator 62, so as to prepare a synchronization pulse signal which is determined by the stage velocity and the interferometer resolution, and supplies this signal to a counter 165.

Since the start Y-coordinate data of the stage 7 are stored in the counter 165, target stage Y-coordinate data are calculated according to the synchronization pulse signal supplied thereto.

The interferometer 160 within the laser interferometer system 9 reads out X- and Y-axial stage coordinate data while the stage is moving, thus read-out signals are held by a latch 61 and are subjected to sampling at a sampling frequency of 100 kHz, and the resulting signals are outputted to the DSP 148 (see FIG. 21).

Fed into a subtractor 166 within the DSP 148 are the current stage Y-coordinate data from the laser interferometer system 9 and the target stage Y-coordinate data from the counter 165. The DSP 148 determines the difference therebetween, thereby computing the amount of positional deviation of stage in Y-axis direction (step ST1). This amount of positional deviation of stage in Y-axis direction is the amount of positional deviation generated by the speed fluctuation of the stage 7 in Y-axis direction. The DSP 148 computes the rotational speed of the motor 153 for correcting this amount of positional deviation.

A rotational speed control signal is outputted from the DSP 148 as a Y-stage control signal, which is then converted into analog data by way of the D/A converter 158, and the resulting data are amplified by the power amplifier 157 and then are supplied to the motor 153. The motor 153 rotates at the target rotational speed, thereby correcting the speed fluctuation of the stage 7 in Y-axis direction (step ST2).

Here, the RE 154 and the counter 159 detect the rotational speed of the motor 153, whereas the DSP 148 carries out feedback control such that the detected rotational speed equals the target rotational speed.

On the other hand, the current X-coordinate data of the stage 7 are fed into a subtractor 167 within the DSP 148 from the laser interferometer system 9. Since reference stage X-coordinate data are stored in the subtractor 167, the current X-coordinate data of the stage 7 and the reference stage X-coordinate data are compared with each other and the difference therebetween is determined, so as to compute the amount of sidewise shifting of the stage 7 in X-axis direction (step ST3) and calculate the amount of X-axial rotation of the motor 153 for correcting this sidewise shifting.

The DSP 148 outputs a rotational amount control signal as an X-stage control signal, which is converted into analog data by way of the D/A converter 158, and the resulting data are amplified by the power amplifier 157 and then are supplied to the motor 153. The motor 153 rotates by the target amount of rotation, thereby correcting the sidewise shifting of the stage 7 in X-axis direction (step ST4).

Here, the TG 152 and the A/D converter 155 detect the amount of rotation of the motor 153, whereas the DSP 148 carries out feedback control such that the detected amount of rotation equals the target amount of rotation.

As the current stage X- and Y-coordinate data detected by the laser interferometer system 9 and the target stage X- and Y-coordinate data are compared with each other and the stage control system 510 drives and controls the stage 7 so as to correct the differences between these data in the foregoing manner, the speed fluctuations and sidewise shifting of the stage 7 are corrected.

However, the positional deviation correction by driving the stage 7 cannot completely correct positional deviations, whereby residual errors may occur in practice. Therefore, in order to correct the residual errors, the projected position of the sample image is further corrected by the deflector 22a.

Figure 24A:
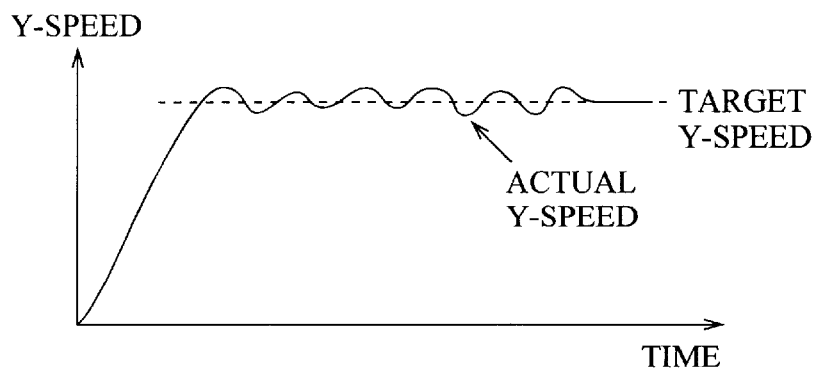
FIGS. 24A to 24C are drawings for explaining an operation of correcting residual errors in the fifth embodiment.

For example, FIG. 24A is a graph which plots the speed of the Y-stage while the stage is moving. The speed is servo-controlled by the stage control system 510 so as to follow a target Y-speed (which forms a trapezoid in this example). In practice, however, the stage does not completely match the target speed, thus yielding speed fluctuations.

Figure 24B:
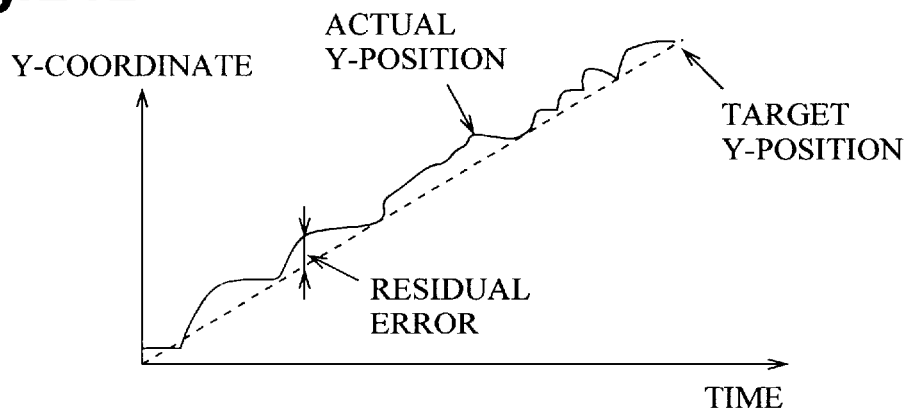

In terms of positional deviations, even when the positional deviation correction is effected by the stage control system 510, a positional deviation occurs between the target Y-position and the actual Y-position due to a time lag or the like as shown in FIG. 24B. This is a residual error.

In a specific operation of correcting residual errors, the current Y-coordinate data of the stage 7 (which are data detected after the positional deviation correction of the stage 7 has already been carried out by the stage control system 510) are initially fed into the subtractor 166 from the laser interferometer system 9 as shown in FIG. 22.

The subtractor 166 compares thus inputted data with the target stage Y-coordinate data of the counter 165, so as to determine the difference therebetween, from which a Y-projection correction signal is generated (step ST5). In conformity to this signal, the deflector control system 20b and the deflector 22a correct the projected position of the sample image (step ST6).

Namely, this signal is supplied to the deflector 22a, so that the image projected onto the image pickup surface of the CCD TDI array 35 is shifted in Y-axis direction by the amount of residual error.

Subsequently, as the current Y-coordinate data of the stage 7 are inputted from the laser interferometer system 9, the subtractor 166 computes the difference between thus inputted data and the target stage Y-coordinate data. Then, the stage control system 510 directly drives the stage 7 at first, so as to correct the positional deviation in Y-axis direction.

Thereafter, the projected position of the sample image is shifted in Y-axis direction by the deflector 22a, so as to correct the amount of residual error of the stage 7 not corrected by the stage control system 510.

As regards X-axis direction, minute vibrations cannot completely be corrected even if the sidewise shifting in X-axis direction can completely be corrected by driving the stage 7 by the stage control system 510.

Figure 24C:
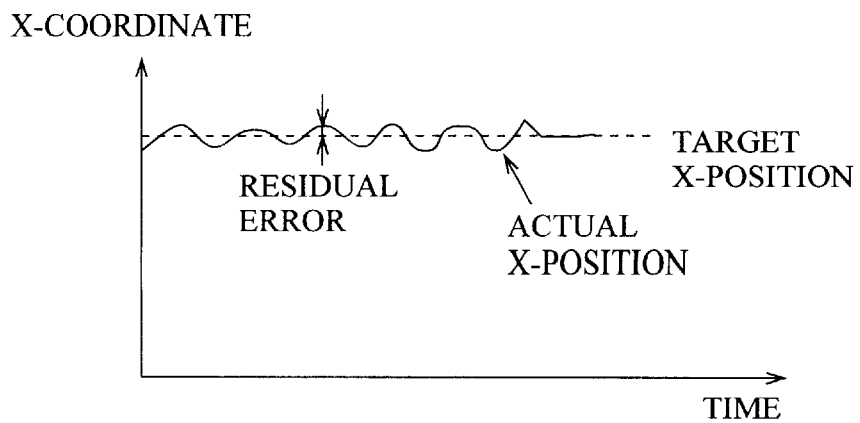

Therefore, as shown in FIG. 24C, a positional deviation occurs between the target X-position and the actual X-position, thereby yielding a residual error.

In a specific operation of correcting residual errors, the current X-coordinate data of the stage 7 (which are data detected after the positional deviation correction of the stage 7 has already been carried out by the stage control system 510) are initially fed into the subtractor 167 from the laser interferometer system 9 as shown in FIG. 22.

The subtractor 167 compares thus inputted data with the reference stage X-coordinate data, so as to determine the difference therebetween, from which an X-projection correction signal is generated (step ST7), whereby the deflector control system 20b and the deflector 22a correct the projected position of the sample image (step ST8).

Namely, this signal is supplied to the deflector 22a, so that the image projected onto the image pickup surface of the CCD TDI array 35 is shifted in X-axis direction by the amount of residual error.

Subsequently, as the current X-coordinate data of the stage 7 are successively inputted from the laser interferometer system 9, the subtractor 167 computes the difference between thus inputted data and the reference stage X-coordinate data. Then, the stage control system 510 directly drives the stage 7 at first, so as to correct the positional deviation in X-axis direction.

Thereafter, the projected position of the sample image is shifted in X-axis direction by the deflector 22a, so as to correct the amount of residual error of the stage 7 not corrected by the stage control system 510.

Thus, in the electron beam inspection apparatus according to the fifth embodiment, the positional deviations of the stage 7 in X- and Y-axis directions are corrected by driving the stage, and the amount of residual error not corrected by this correction is corrected by changing the projected position of the sample image by use of the deflector 22a. As a consequence, even if speed fluctuations, sidewise shifting, vibrations, and the like occur in the stage 7, the sample image projected onto the image pickup surface of the CCD TDI array 35 will not positionally fluctuate, whereby vivid images can always be acquired.

Also, though the positional deviations are corrected by two steps, i.e., driving the stage and deflecting the beam, the correction by use of the deflector can correct positional deviations very fast, whereby the throughput of inspection would not deteriorate.

Sixth Embodiment

Though the stage 7 is moved in Y-axis direction alone in the above-mentioned fifth embodiment, it is necessary to obliquely drive the stage 7 when there is a slight inclination (rotation) in the sample. The following explanation of the sixth embodiment relates to a case where the stage 7 is moved in both X- and Y-axis directions.

The characteristic feature in the configuration of the sixth embodiment lies in that a counter 168 is disposed within the DSP 148, whereas the other constituents are identical to those in the fifth embodiment (FIG. 18). In the following, an operation of the sixth embodiment will be explained with reference to FIGS. 21 and 25 in a manner similar to the fifth embodiment.

Figure 25:
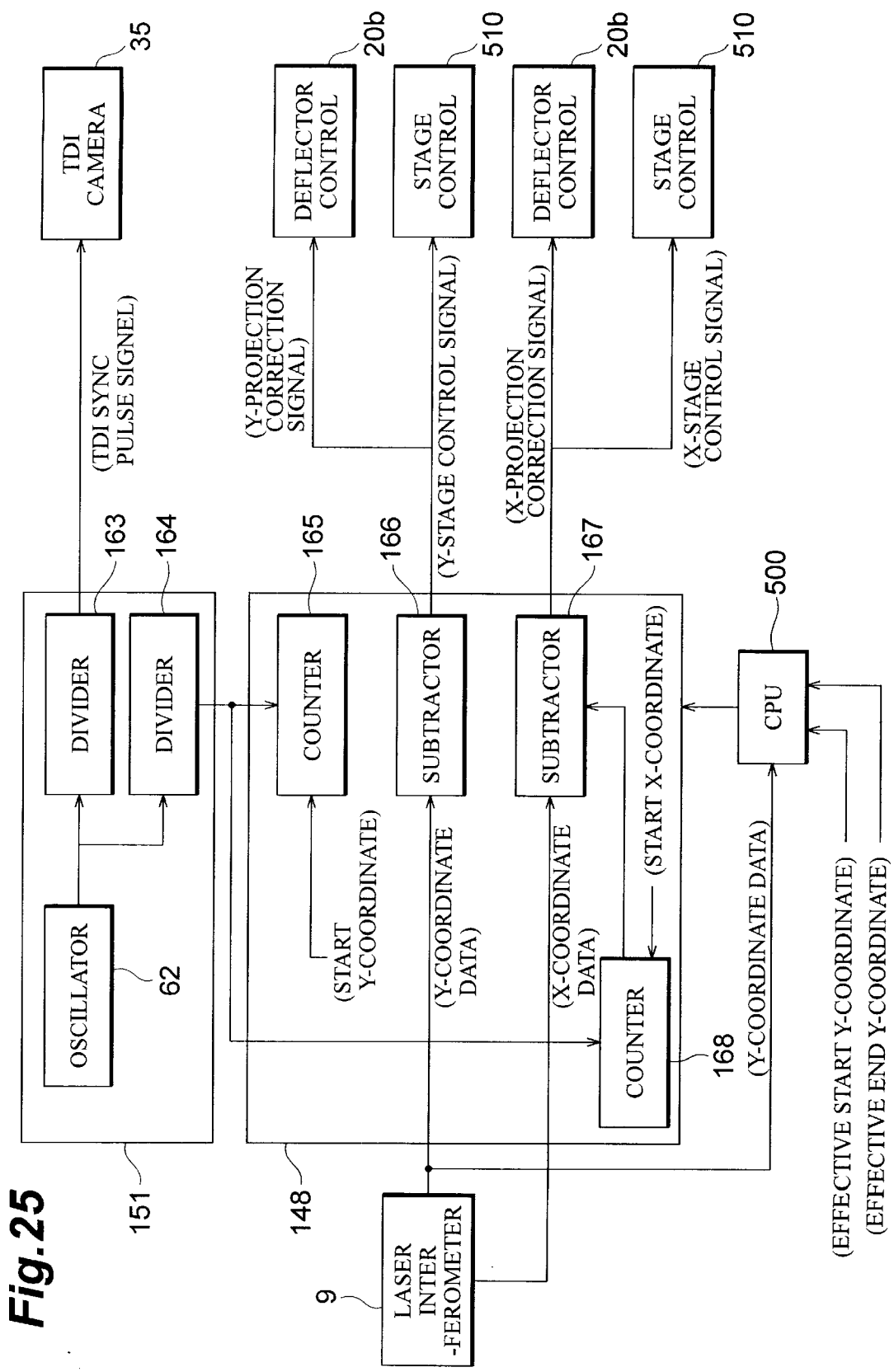
FIG. 25 is a block diagram to show the schematic configuration of the DSP, in particular, in the sixth embodiment of the inspection apparatus according to the present invention.

In FIG. 25, since the start Y-coordinate data of the stage 7 are stored in the counter 165, target stage Y-coordinate data are counted according to the synchronization pulse signal supplied from the divider 164. Also, since the start X-coordinate data of the stage 7 are stored in the counter 168, target stage X-coordinate data are counted according to the synchronization pulse signal supplied from the divider 164.

The interferometer 160 within the laser interferometer system 9 reads out the X- and Y-axial coordinate data of the stage while the stage is being moved, thus read-out signal is held by the latch 61 and is subjected to sampling at a sampling frequency of 100 kHz, and the resulting signals are outputted to the DSP 148 (see FIG. 21).

Fed into the subtractor 166 within the DSP 148 are the current Y-coordinate data of the stage 7 from the laser interferometer system 9 and the target stage Y-coordinate data from the counter 165. The DSP 148 determines the difference therebetween, thereby computing the amount of positional deviation in Y-axis direction, so as to calculate the rotational speed of the motor 153 for correcting the speed fluctuation in Y-axis direction and the amount of rotation of the motor 153 for correcting the sidewise shifting in Y-axis direction.

On the other hand, fed into the subtractor 167 within the DSP 148 are the current X-coordinate data of the stage 7 from the laser interferometer system 9 and the target stage X-coordinate data from the counter 168. The DSP 148 determines the difference therebetween, thereby computing the amount of positional deviation in X-axis direction, so as to calculate the rotational speed of the motor 153 for correcting the speed fluctuation in X-axis direction and the amount of rotation of the motor 153 for correcting the sidewise shifting in X-axis direction.

The stage control system 510 controls the motor 153 so as to make it attain the target rotational speed and amount of rotation, and drives and controls the stage 7, thereby correcting the speed fluctuations and sidewise shifting of the stage in X- and Y-axis directions.

In practice, however, the positional deviation correction by driving the stage 7 cannot completely correct the positional deviation, thus yielding residual errors. Therefore, in order to correct these residual errors, the projected position of the sample image is further corrected by the deflector 22a.

The operation of correcting residual errors will not be explained here in detail, since it is similar to that in the above-mentioned fifth embodiment. Considered here will be a case where the stage 7 is moved in conformity to Y=aX+b as shown in FIG. 26.

Figure 26:
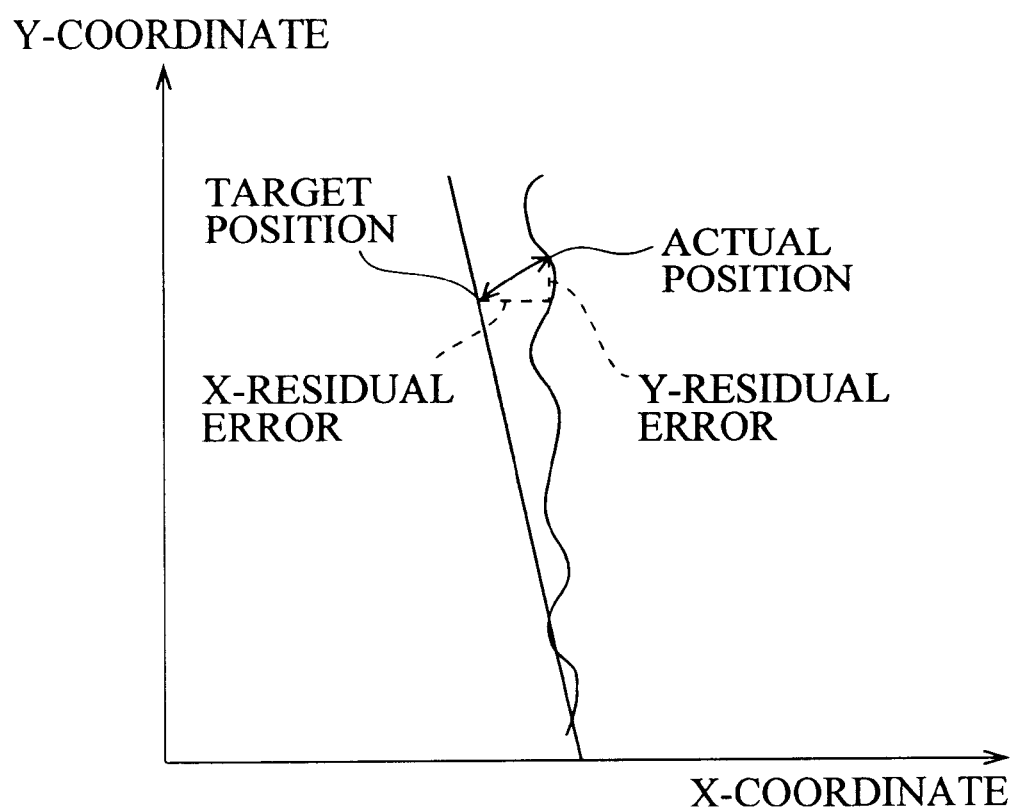
FIG. 26 is a drawing for explaining an operation of correcting residual errors in the sixth embodiment.

Even when positional deviations are corrected by the stage control system 510, residual errors may exist in X- and Y-axis directions in practice as shown in FIG. 26. These residual errors are corrected as the deflector 22a shifts the image projected onto the image pickup surface of the CCD TDI array 35 in X- and Y-axis directions by the respective amounts of residual errors.

As a consequence, even if speed fluctuations, sidewise shifting, vibrations, and the like in X- and Y-axis directions occur in the stage 7, the CCD TDI array 35 can always acquire vivid sample images.

Though both of the positional deviation correction by the stage control system 510 and the positional deviation correction by the deflector control system 20b and deflector 22a are carried out in the fifth and sixth embodiments, the correction may be effected, without being restricted thereto, by one of them alone. In particular, when the positional deviation is small, it can be processed at a high speed when the correction is carried out by the deflector alone.

Also, the positional deviation correction by driving the stage and the positional deviation correction by the deflector may be switched therebetween when appropriate. For example, they may selectively be switched therebetween such that the correction by driving the stage and the correction by the deflector are effected when the observation magnification is low and high, respectively.

Though the positional deviation is corrected as the secondary beam is deflected by the deflector 22*a* in the fifth and sixth embodiments, the correction system is not restricted thereto. For example, the secondary optical system comprising the cathode lens 55 and the second lens 21*a*-1 to fourth lens 21*a*-3 may shift the image-forming position of the second beam on the detection surface, so as to correct the positional deviation.

As explained in the foregoing, the electron beam inspection apparatus according to the fifth and sixth embodiments comprises a structure by which, even when a deviation in timing (synchronization deviation) occurs between the charge transfer and the stage driving, the synchronization deviation can be detected. Consequently, according to whether the synchronization deviation is detected or not, it can be determined whether the array image pickup portion has succeeded in normally picking up a sample image or not.

For example, even in the case where the stage position deviates due to speed fluctuations, vibrations, and the like occurring while the stage is being driven, whereby the position of the optical image on the detection surface is shifted, the position of the optical image can be corrected to its original position by the correction system in the fifth and sixth embodiments. Consequently, the sharpness of the image would not deteriorate even when the image is picked up by the array image pickup portion.

Also, in the fifth and sixth embodiment, the second beam can be deflected so as to correct the positional deviation of the optical image as the correction system, whereby the sharpness of the image can be inhibited from lowering when the image is picked up by the array image pickup portion. Further, since this correction utilizes the beam deflection, a high response can be obtained, whereby the positional deviation can be corrected at a high speed, and the throughput of the inspection can be improved.

Thus, in the electron beam inspection apparatus according to the fifth and sixth embodiments, even if speed fluctuations, vibrations, sidewise shifting, and the like of the stage occur, so that the position of an optical image on the detection surface fluctuates, the positional deviation of the optical image can be corrected by the correction system (deflector in particular), whereby vivid sample images can always be acquired even when picked up by the CCD TDI array, and defects can be detected with a high reliability.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

The basic Japanese Applications No. 1178/1997 filed on Jan. 8, 1997, No. 1179/1997 filed on Jan. 8, 1997, No. 1181/1997 filed on Jan. 8, 1997, No. 282394/1998 filed on Oct. 5, 1998 are hereby incorporated by reference

What is claimed is:

1. A pattern inspection apparatus for successively inspecting a plurality of patterns provided on a surface of a sample, comprising:

a stage movable with said sample being mounted thereon;

an illumination system disposed at a position facing said stage, said illumination system emitting an electron beam to an electron beam irradiation area including an inspection target area of the surface of said sample;

a position detecting system disposed at a position adjacent to said stage, said position detecting system detecting a position of said stage;

an electron detecting system disposed at a position facing said stage, said electron detecting system having a microchannel plate that detects at least one of secondary electrons, reflected electrons, and back-scattered electrons emerging from the electron beam irradiation area on said sample and that multiplies said at least one of secondary electrons, reflected electrons, and back-scattered electrons arriving thereat from said electron beam irradiation area, a fluorescent section disposed at a position adjacent to said microchannel plate, said fluorescent section converting a group of electrons multiplied and outputted by said microchannel plate to light, a Charge Coupled Device (CCD) Time Delay Integration (TDI) array that is placed opposite to said microchannel plate with said fluorescent section in between and that receives the light excited by said fluorescent section, and a detection control system connected to said CCD TDI array, said detection control system controlling driving of said CCD TDI array, based on information about a position of the electron beam irradiation area on said sample, obtained from said position detecting system; and a scan control mechanism connected to said illumination system, said position detecting system and said electron detecting system, said scan control mechanism continuously moving the stage while checking the position of said stage, based on an output signal from said position detecting system, in such a state that an irradiation direction of said electron beam emitted from said illumination system toward said sample is kept stationary in a predetermined direction.

2. The apparatus according to claim 1, wherein a shape of said electron beam irradiation area on said sample is rectangular.

3. The apparatus according to claim 1, wherein a shape of said electron beam irradiation area on said sample is elliptic.

4. A pattern inspection apparatus for successively inspecting a plurality of patterns provided on a surface of a sample, comprising;

a stage movable with said sample being mounted thereon;

an irradiation system disposed at a position facing said stage, said illumination system emitting an electron beam to an electron beam irradiation area including an inspection target area of the surface of said sample;

an electron detecting system disposed at a position adjacent to said stage, said electron detecting system having a microchannel plate that detects at least one of secondary electrons, reflected electrons, and back-scattered electrons emerging from the electron beam irradiation area on said sample and that multiplies said at least one of secondary electrons, reflected electrons, and back-scattered electrons arriving thereat from said electron beam irradiation area, a fluorescent section disposed at a position adjacent to said microchannel plate, said fluorescent section converting a group of electrons multiplied and outputted by said microchannel plate to light, a Charge Coupled Device (CCD) Time Delay Integration (TDI) array that is placed opposite to said microchannel plate with said fluorescent section in between and that receives the light excited by said fluorescent section, and a detection control system connected to said CCD TDI array, said detection control system controlling driving of said CCD TDI array, based on information about a position of the electron beam irradiation area on said sample, obtained from said position detecting system; and a scan control mechanism connected to said illumination system, said position detecting system and said electron detecting system, said scan control mechanism continuously moving the electron beam irradiation area on said sample in a predetermined direction in such a state that said stage is kept stationary at a predetermined position.

5. A pattern inspection apparatus for successively inspecting a plurality of patterns provided on a surface of a sample, comprising:

a stage movable with said sample being mounted thereon;

an irradiation system disposed at a position facing said stage, said illumination system emitting an electron beam to an electron beam irradiation area including an inspection target area of the surface of said sample;

a position detecting system disposed at a position adjacent to said stage, said position detecting system detecting a position of said stage; and an electron detecting system disposed at a position adjacent to said stage, said electron detecting system having a microchannel plate that detects at least one of secondary electrons, reflected electrons, and back-scattered electrons emerging from the electron beam irradiation area on said sample and that multiplies said at least one of secondary electrons, reflected electrons, and back-scattered electrons arriving thereat from said electron beam irradiation area, a fluorescent section disposed at a position adjacent to said microchannel plate, said fluorescent section converting a group of electrons multiplied and outputted by said microchannel plate to light, a Charge Coupled Device (CCD) Time Delay Integration (TDI) array that is placed opposite to said microchannel plate with said fluorescent section in between and that receives the light excited by said fluorescent section, and a shielding structure that temporarily intercepts the light incident to said CCD TDI array.

6. A pattern inspection method of successively inspecting a plurality of patterns provided on a surface of a sample by use of an electron beam, comprising:

a first step of moving an inspection target area on said sample into a space where an electron beam emitted from an irradiation system arrives;

a second step of continuously moving an electron beam irradiation area on said sample, said electron beam irradiation area being an area irradiated by said electron beam and including said inspection target area, and a third step of detecting by a Charge Coupled Device (CCD) Time Delay Integration (TDI) array information about an image of said inspection target area, included in a group of electrons consisting of at least either of secondary electrons, reflected electrons, and back-scattered electrons emerging from said electron beam irradiation area.

7. The method according to claim 6, wherein in said second step said sample is continuously moved in such a state that an irradiation direction of the electron beam emitted from said irradiation system is kept stationary in a predetermined direction.

8. The method according to claim 6, wherein in said second step the electron beam irradiation area on said sample is shifted in a predetermined direction in such a state that said stage is kept stationary at a predetermined position.

9. The method according to claim 6, wherein the group of electrons from said electron beam irradiation area are converted to light by a fluorescent member located at a position where the group of electrons arrive and the light excited by said fluorescent member is made incident to said CCD TDI array.

10. The method according to claim 9, wherein the group of electrons from said electron beam irradiation area are multiplied by a microchannel plate located at the position where the group of electrons arrive and the group of electrons multiplied by said microchannel plate are made incident to said fluorescent member.

11. A pattern inspection apparatus for successively inspecting a plurality of patterns provided on a surface of a sample by use of an electron beam, comprising:

a stage movable with said sample being mounted thereon;

an illumination system disposed at a position facing said stage, said illumination system emitting an electron beam to an electron beam irradiation area including an inspection target area of the surface of said sample;

a position detecting system disposed at a position adjacent to said stage, said position detecting system detecting a position of said stage;

an electron detecting system disposed at a position adjacent to said stage, said electron detecting system having a Charge Coupled Device (CCD) Time Delay Integration (TDI) array that detects a group of electrons consisting of at least one of secondary electrons, reflected electrons, and back-scattered electrons emerging from the electron beam irradiation area on said sample and that detects information about an image of said inspection target area, included in the group of electrons, and a detection control system connected to said CCD TDI array, said detection control system controlling driving of said CCD TDI array, based on information about a position of the electron beam irradiation area on said sample, obtained from said position detecting system; and a scan control mechanism connected to said illumination system, said position detecting system and said electron detecting system, said scan control mechanism successively moving the electron beam irradiation area on said sample while checking the position of said stage, based on an output signal from said position detecting system.

12. The apparatus according to claim 11, wherein said scan control mechanism continuously moves the stage while checking the position of said stage, based on the output signal from said position detecting systems in such a state that an irradiation direction of said electron beam emitted from said illumination system toward said sample is kept stationary in a predetermined direction.

13. The apparatus according to claim 11, wherein said scan control mechanism shifts the electron beam irradiation area on said sample in a predetermined direction in such a state that said stage is kept stationary at a predetermined position.

14. The apparatus according to claim 11, further comprising a fluorescent section facing said CCD TDI array, said fluorescent section being located at a position where the group of electrons consisting of at least one of secondary electrons, reflected electrons, and back-scattered electrons from said electron beam irradiation area arrive and converting the group of electrons to light.

15. The apparatus according to claim 14, further comprising a microchannel plate adjacent to said fluorescent section, said microchannel plate being located at the position where the group of electrons consisting of at least one of secondary electrons, reflected electrons, and back-scattered electrons from said electron beam irradiation area arrive and multiplying the group of electrons and outputting electrons to said fluorescent section.

16. An inspection apparatus for successively inspecting a plurality of patterns provided on a surface of a sample by making use of an electron beam, comprising:
   a stage movable with said sample being mounted thereon;
   an irradiation system disposed at a position facing said stage, said irradiation system emitting an electron beam to an electron beam irradiation area including an inspection target area on the surface of said sample, said irradiation system hawing a first alignment deflector that deflects the electron beam;
   an electron detecting system disposed at a position adjacent to said stage, said electron detecting system having a microchannel plate that detects at least one of secondary electrons, reflected electrons, and back-scattered electrons emerging from the electron beam irradiation area on said sample and that multiplies said at least one of secondary electrons, reflected electrons, and back-scattered electrons arriving thereat from said electron beam irradiation area, a fluorescent section disposed at a position adjacent to said microchannel plate, said fluorescent section converting a group of electrons multiplied and outputted by said microchannel plate to light, a Charge Coupled Device (CCD) Time Delay Integration (TDI) array that is placed opposite to said microchannel plate with said fluorescent section in between and that receives the light excited by said fluorescent section, and a second alignment deflector that deflects the electron beam emerging from said electron beam irradiation area;
   an image display system connected to said electron detecting system, said image display system displaying an image of the inspection target area included in the electron beam irradiation area on said sample, based on an output signal from said electron detecting system; and
   a correction control system connected to said electron detecting system, said correction control system correcting at least one of a position and a rotational angle of an electron image to be detected by said electron detecting system, based on information about positional deviation of said stage, said electron image being an image of the electron beam irradiation area formed by the electron beam emerging from said electron beam irradiation area.

17. The apparatus according to claim 16, wherein said correction control system comprises an arithmetic section that calculates an amount of the positional deviation of said stage from information about the position of said stage obtained from said position detecting system and information of drive instruction of the stage.

18. The apparatus according to claim 17, wherein the information about the positional deviation of said stage includes at least one of first positional deviation information corresponding to an amount of deviation along a first direction in which the stage is movable, second positional deviation information corresponding to an amount of deviation along a second direction perpendicular to said first direction, and third positional deviation information corresponding to an angle of rotational deviation about a third direction perpendicular to said first and second directions.

19. The apparatus according to claim 16, wherein said correction control system comprises an alignment control system that controls said first and second alignment deflectors independently of each other.

20. The apparatus according to claim 19, wherein said alignment control system performs a correction operation every output of image information of one line unit from said CCD TDI array.

21. The apparatus according to claim 16, wherein said correction control system comprises a driving section that moves said CCD TDI array and a drive control system that outputs a drive signal to said driving section.

22. The apparatus according to claim 16, wherein a shape of said electron beam irradiation area on said sample is rectangular.

23. A pattern inspection apparatus for successively inspecting a plurality of patterns provided on a surface of a sample, comprising:
   a movable stage with said sample being mounted thereon;
   an irradiation system disposed at a position facing said stage, said irradiation system emitting an electron beam to an electron beam irradiation area including an inspection target area of the surface of said sample;
   an electron detector disposed at a position adjacent to said stage, said electron detector detecting an electron image of said inspection target area while moving an electron incident surface of said electron detector, said electron image being formed by at least one of secondary electrons, reflected electrons, and back-scattered electrons emerging from the electron beam irradiation area on said sample irradiated by said electron beam; and
   a projection type electron optical system disposed at a position facing said inspection target area, said projection type electron optical system focusing the electron image of said inspection target area on said electron incident surface of said electron detector,
   wherein said electron detector comprises a Charge Coupled Device (CCD) Time Delay Integration (TDI) array.

24. The apparatus according to claim 23, wherein said CCD TDI array is of a cumulative line changeable type and the number of cumulative lines can be changed according to said sample being an inspected object.

25. A pattern inspection method of successively inspecting a plurality of patterns provided on a surface of a sample by use of an electron beam, comprising:
   a first step of emitting the electron beam to an electron beam irradiation area including an inspection target area on said sample and capturing a group of electrons consisting of at least either of secondary electrons, reflected electrons, and back-scattered electrons emerging from the electron beam irradiation area;
   a second step of focusing an electron image formed by the group of electrons emerging from said electron beam irradiation area at a predetermined magnification on an electron incident surface of an electron detector;
   a third step of getting said electron image to be scanned on said electron incident surface of said electron detector; and
   a fourth step carried out after said second step, said fourth step being a step of inverting the electron image detected by said electron detector and displaying an inverted image thereof on an image display system by controlling a projection type electron optical system projecting said electron image from said electron beam irradiation area to said electron detector,
   wherein said electron detector comprises a Charge Coupled Device (CCD) Time Delay Integration (TDI) array.

26. The method according to claim 25 wherein said CCD TDI array is of a cumulative line changeable type and the number of cumulative lines can be changed according to said sample being an inspected object.

27. A pattern inspection apparatus for inspecting a plurality of patterns provided on a surface of a sample, comprising:
a stage movable with said sample being mounted thereon;
an illumination system disposed at a position facing said stage, said illumination system emitting an electron beam to an electron beam irradiation area including an inspection target area of the surface of said sample;
a position detecting system disposed at a position where said stage is adjacent to, said position detecting system detecting a position of said stage; and
an electron detecting system disposed at a position facing said stage, said electron detecting system detecting at least one of secondary electrons, reflected electrons, and back-scattered electrons emerging from the electron beam irradiation area on said sample, said electron detecting system comprising:
an image-pickup device that detects information about an image of the inspection target area from the electron beam, said image-pickup device having a structure such that a plurality of one-dimensional line sensors that generate charges by photoelectric conversion are two-dimensionally arrayed, and successively adding up the charges in a predetermined one of said one-dimensional line sensors and charges in one of said one-dimensional line sensors where said image moving in accordance with the moving of said stage is positioned, said state moving on the basis of the output signal from said position detecting system; and
a detection control system that controls driving of said image-pickup device, based on information about a position of the electron beam irradiation area on said sample, obtained from said position detecting system.

28. An apparatus according to claim 27, wherein said image-pickup device includes a Charge Coupled Device (CCD) Time Delay Integration (TDI) array.

29. A method of fabricating a pattern inspection apparatus, comprising the steps of:
providing an electron beam source;
providing a stage movable with a sample being mounted thereon;
providing an illumination system disposed at a position facing said stage, said illumination system emitting an electron beam to an electron beam irradiation area including an inspection target area of the surface of said sample; and
providing an electron detecting system disposed at a position facing said stage, said electron system detecting at least one of secondary electrons, reflected electrons, and back-scattered electrons emerging from the electron beam irradiation area on said sample, said electron detecting system comprising:
an image-pickup device that detects information about an image of the inspection target area from the electron beam, said image-pickup device having a structure such that a plurality of one-dimensional line sensors that generate charges by photoelectric conversion are two-dimensionally arrayed, and successively adding up the charges in a predetermined one of said one-dimensional line sensors and charges in one of said one-dimensional line sensors where said image moving in accordance with the moving said stage is positioned, said stage moving on the basis of an output signal from a position detecting system; and
a detection control system connected to a Charge Coupled Device (CCD) Time Delay Integration (TDI) array that is included in said image pickup device, wherein said detection control system controls driving of said image-pickup device, based on information about a position of the electron beam irradiation area on said sample, obtained from said position detecting system.

30. An electron beam inspection apparatus comprising:
an electron detecting system for irradiating a sample mounted on a stage with an electron beam and detecting a secondary beam comprising at least one of secondary and reflected electrons generated from an irradiated area of said sample, so as to generate an image of said irradiated area, said electron detecting system having:
a detection surface on which the image of said irradiated area is produced,
a converter disposed on said detection surface so as to convert said secondary beam into light, and
an array image-pickup portion provided with pixels two-dimensionally arranged so as to constitute a plurality of lines, said array image-pickup portion successively transferring, in synchronization with a transfer signal, charges of pixels constituting each line generated upon receiving an optical image obtained by said converter to addressed corresponding pixels in an adjacent line thereof while adding thereto charges in said addressed pixels, thus successively outputting charges of individual pixels constituting a final line to which charges of individual pixels in a predetermined number of lines to said final line have been added;
a projection electronic optical system, disposed between said sample and said electron detecting system, for forming an image of said secondary beam onto the detection surface of said electron detecting system;
a transfer signal control portion for outputting said transfer signal;
a stage control system for driving said stage so as to move said optical image formed on said detection surface;
a position detecting system for detecting a position of said stage; and
a synchronization deviation detecting system for detecting, according to said transfer signal and a detection signal of said position detecting system, a synchronization deviation between the transferred charges between said adjacent lines and the movement of said optical image by driving said stage.

31. An electron beam inspection apparatus according to claim 30, further comprising a correction system for correcting a positional deviation of the optical image on said detection surface computed according to the synchronization deviation detected by said synchronization deviation detecting system.

32. An electron beam inspection apparatus according to claim 31, wherein said correction system includes a beam deflector for deflecting said secondary beam.

* * * * *